(12) United States Patent
Deshpande et al.

(10) Patent No.: US 9,837,603 B1
(45) Date of Patent: Dec. 5, 2017

(54) POST-ETCH ENCAPSULATION FOR A MAGNETORESISTIVE DEVICE

(71) Applicant: Everspin Technologies, Inc., Chandler, AZ (US)

(72) Inventors: Sarin A. Deshpande, Chandler, AZ (US); Sanjeev Aggarwal, Scottsdale, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

(21) Appl. No.: 15/291,999

(22) Filed: Oct. 12, 2016

(51) Int. Cl.
| | |
|---|---|
| *H01L 43/08* | (2006.01) |
| *H01L 43/12* | (2006.01) |
| *H01L 43/02* | (2006.01) |
| *H01L 27/22* | (2006.01) |

(52) U.S. Cl.
CPC ............ *H01L 43/08* (2013.01); *H01L 27/222* (2013.01); *H01L 43/02* (2013.01); *H01L 43/12* (2013.01)

(58) Field of Classification Search
CPC ....... H01L 43/08; H01L 43/02; H01L 27/222; H01L 43/12

USPC .................................... 257/295, 421; 438/3
See application file for complete search history.

(56) References Cited

U.S. PATENT DOCUMENTS

| | | | |
|---|---|---|---|
| 2005/0090056 A1* | 4/2005 | Lee .................. | H01L 43/12 438/257 |
| 2016/0218283 A1* | 7/2016 | Trinh ................ | H01L 45/08 |
| 2016/0308119 A1* | 10/2016 | Hsu .................. | H01L 43/08 |
| 2016/0365505 A1* | 12/2016 | Lu .................... | H01L 27/222 |

* cited by examiner

*Primary Examiner* — Cuong Q Nguyen
*Assistant Examiner* — Tong-Ho Kim
(74) *Attorney, Agent, or Firm* — Bookoff McAndrews, PLLC

(57) ABSTRACT

Encapsulation of the magnetoresistive device after formation protects the sidewalls of the magnetoresistive device from degradation during subsequent deposition of interlayer dielectric material. The encapsulation also helps prevent short circuits between the top electrode of the magnetoresistive device and underlying layers within the magnetoresistive device. The encapsulation can be accomplished by depositing a layer of encapsulating material after device formation, where an etch back operation selectively removes the portions of the layer of encapsulating material other than the material on the sidewalls of the magnetoresistive device.

20 Claims, 28 Drawing Sheets

POST-ETCH ENCAPSULATION FOR A MAGNETORESISTIVE DEVICE

TECHNICAL FIELD

The disclosure herein relates generally to magnetoresistive devices and more particularly to protective encapsulation of magnetic layers following formation of such devices on an integrated circuit.

BACKGROUND

Magnetoresistive devices include magnetic memory devices such as magnetic random access memory (MRAM) and magnetic sensors. Magnetic memory devices store information by varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetic layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the orientation of the free portion. The information is later retrieved by sensing the orientation of the free portion. Such magnetic memory devices are well known in the art.

Writing to magnetic memory cells can be accomplished by sending a spin-polarized write current through the memory device where the angular momentum carried by the spin-polarized current can change the magnetic state of the free portion. One of ordinary skill in the art understands that such a current can either be directly driven through the memory cell or can be the result of applying one or more voltages where the applied voltages result in the desired current. Depending on the direction of the current through the memory cell, the resulting magnetization of the free portion will either be parallel or antiparallel to the fixed portion. If the parallel orientation represents a logic "0", the antiparallel orientation may represent a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

Manufacturing magnetoresistive devices, including MTJ devices, includes a sequence of processing steps during which many layers of materials are deposited and then patterned to form a magnetoresistive stack and the electrodes used to provide electrical connections to the magnetoresistive stack. The magnetoresistive stack includes the various layers that make up the free and fixed portions of the device as well as one or more dielectric layers that provide at least one the tunnel junction for the MTJ device. In many instances, the layers of material are very thin—on the order of a few or tens of angstroms. Similarly, the dimensions of such layers after patterning and etching are extremely small, and small deviations or imperfections during processing can have a significant impact on device performance.

Because an MRAM device may include millions of MTJ elements, precise processing steps used in manufacturing the devices can contribute to increased densities by allowing devices to be placed in close proximity without unwanted interaction. Moreover, such accurate processing helps to minimize deviations in device characteristics, such as switching voltages, across devices included in the MRAM. Therefore, it is desirable to provide techniques for manufacturing such devices that support increased densities and promote minimizing the variance of certain characteristics amongst devices.

DETAILED DESCRIPTION

Figure 1:
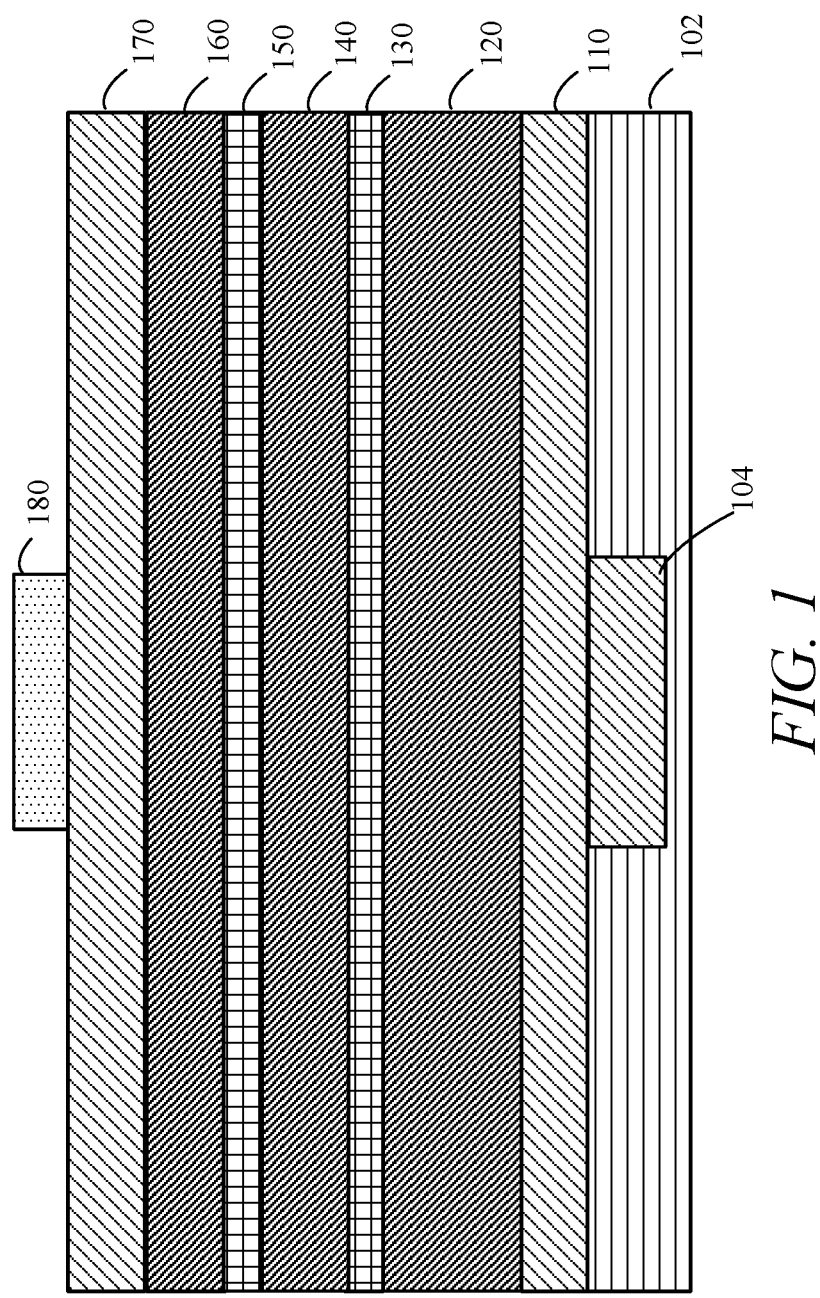
FIGS. 1-8 illustrate cross-sectional views of layers included in a magnetoresistive device during different stages of the manufacturing of a magnetoresistive device in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to improve understanding of the example embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Moreover, while certain layers and features are illustrated with straight 90-degree edges, in actuality or practice such layers may be more "rounded" and gradually sloping.

The terms "comprise," "include," "have" and any variations thereof are used synonymously to denote non-exclusive inclusion. The term "exemplary" is used in the sense of "example," rather than "ideal."

During the course of this description, like numbers may be used to identify like elements according to the different figures that illustrate the various exemplary embodiments.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. An etch may then be applied to the underlying layer not protected by the remaining resist such that the layer overlying the substrate is patterned. Alternatively, an additive process can be used in which a structure is built up using the photoresist as a template.

There are many inventions described and illustrated herein, as well as many aspects and embodiments of those inventions. In one aspect, the described embodiments relate to, among other things, methods of manufacturing a magnetoresistive-based device having one or more electrically conductive electrodes or conductors on either side of a magnetic material stack. As described in further detail below, the magnetic material stack may include many different layers of material, where some of the layers include magnetic materials, whereas others do not. In one embodiment, the methods of manufacturing include forming the layers for the magnetoresistive device and then masking and etching those layers to produce a magnetic tunnel junction (MTJ) device. Examples of MTJ devices include transducers such as electromagnetic sensors as well as magnetic memory cells.

Magnetoresistive devices are typically formed to include a top electrode and a bottom electrode that permit access to the device by allowing for connectivity to other circuit elements. Between the electrodes is a set of layers, including a fixed layer and a free layer on either side of a dielectric layer that forms a tunnel barrier. In some embodiments, the fixed layer achieves its fixed magnetization based on interaction with an antiferromagnetic material. In other embodiments, the fixed magnetization may be achieved through other means, including the manner in which the fixed layer was formed, shape anisotropy, etc. In manufacturing such magnetoresistive devices, a set of layers is first deposited on the wafer and then patterned and etched in order to define the electrodes and the various layers there between. Some of the materials included in the layers within the magnetoresistive device are susceptible to oxidation or other degradation during reactive etching steps as well as steps involving the deposition of interlayer dielectric material that surrounds and isolates the magnetoresistive devices. Such oxidation or degradation can be detrimental as it may interfere with the magnetic behavior of the device or interfere with subsequent processing steps. In particular, sidewalls of the layers of magnetic material included in the free or fixed layer may be vulnerable to the corrosive atmosphere and gases used during depositing of interlayer dielectric material in later processing steps. In addition to the being subject to possible degradation based on exposure to corrosive gases, the formation of contacts or vias in the interlayer dielectric material can result in shorting between the contacts or vias and underlying layers in the magnetoresistive stack, thereby creating unwanted electrical connections that compromise device functionality.

In order to avoid undesirable impacts on layers included in the magnetoresistive device stack structure, one technique described herein provides for encapsulation of the magnetoresistive device after formation of the device and prior to deposition of interlayer dielectric material. In some embodiments, the encapsulation includes depositing a layer of insulating, encapsulation material and etching back to only leave the encapsulation material on the sidewalls of the completed magnetoresistive devices. The encapsulation material, which in some embodiments consists of or includes silicon nitride, coats and protects the sidewalls from the corrosive atmosphere created during deposition of interlayer dielectric material. The encapsulation material also serves as an etch stop during formation of a contact or via that provides electrical connection to the top portion of the magnetoresistive device. By serving as an etch stop during the etching operations that form the hole in which the contact or via is formed, the encapsulating material prevents unwanted short circuits between the contact or via and lower layers in the magnetoresistive device.

By protecting the sidewalls of the magnetoresistive devices from the interlayer dielectric deposition chemistry, the characteristics of the magnetoresistive device are improved in terms of consistency. For example, avoiding degradation of the sidewalls ensures that the reading and writing characteristics for the device stay within a narrower deviation from expected values. The degradation that may occur to the sidewalls of some of the magnetoresistive devices can cause greater deviation in switching characteristics amongst magnetoresistive devices in applications such as memory devices. In such memory devices, minimizing deviations in terms of device working characteristics helps ensure accurate operation and enables smaller current to be applied for reading and writing memory cells.

In some embodiments, an array of magnetoresistive devices is included on an integrated circuit with other circuitry, including, for example, logic devices. In one example, an array of MRAM devices is included on an integrated circuit with a processor and/or other logic circuitry. In such embedded embodiments, the processing steps for the magnetoresistive devices may overlap with the processing steps for the logic devices such that some processing steps are used to form structures in both the magnetoresistive device portion of the integrated circuit and the logic portion of the integrated circuit. In such embodiments, the encapsulation material deposited over the entire integrated circuit, which is intended to provide the protection to the sidewalls of the magnetoresistive devices, can be removed from the logic portion of the integrated circuit device during etch back operation such that the encapsulation material does not interfere with the logic processing steps or impact the logic devices or circuits.

FIG. 1 illustrates a cross-sectional view of a partially formed magnetoresistive device disposed on a substrate 102. The cross-sectional view shows a plurality of layers, where each of the layers is formed, deposited, grown, sputtered, or otherwise provided. The layers may be deposited using any technique now known or later developed. The simplified cross-sectional view presented in FIG. 1 includes electrically conductive layer 110, magnetic material layer(s) 120, dielectric layer 130, upper magnetic material layer(s) 140, dielectric layer 150, spacer layer(s) 160, electrically conductive layer 170, and a patterned hard mask layer 180. The patterned hard mask 180 may be deposited and patterned using any technique now known or later developed, for example, well known conventional deposition and lithographic techniques. FIG. 1 also shows a via 104 used to provide an electrical connection to a lower portion of the magnetoresistive device.

The electrically conductive layers 110 and 170 provide the material used to define the top and bottom electrodes for the magnetoresistive device. While illustrated to include example layers 120-160, the layers within the magnetoresistive stack may include a number of different layers of both magnetic and nonmagnetic material. For example, the layers may include multiple layers of magnetic material, dielectric layers that provide one or more tunnel barriers or diffusion barriers, coupling layers between layers of magnetic material that provide for ferromagnetic or antiferromagnetic coupling, anti-ferromagnetic material, and other layers utilized in magnetoresistive stacks as currently known or later developed. For example, the lower layer of magnetic material 120 may include a set of layers forming a synthetic antiferromagnetic structure (SAF), the dielectric layer 130 may correspond to a tunnel barrier, and the upper layer of magnetic material 140 may include a set of layers corresponding to a synthetic ferromagnetic structure (SYF). In the embodiment illustrated, the dielectric layer 150 forms a diffusion barrier, where spacer layer 160 is positioned between that diffusion barrier and the electrically conductive layer 170. In another example embodiment, the dielectric layer 150 and spacer layer 160 are omitted. Notably, each of the layers shown to be included in the magnetoresistive device may be a composite layer that includes multiple sub-layers. Other embodiments may include multiple SAFs, SYFs, and tunnel barriers in addition to the other layers, where the materials and structures are arranged in various combinations and permutations now known or later developed.

Figure 2:
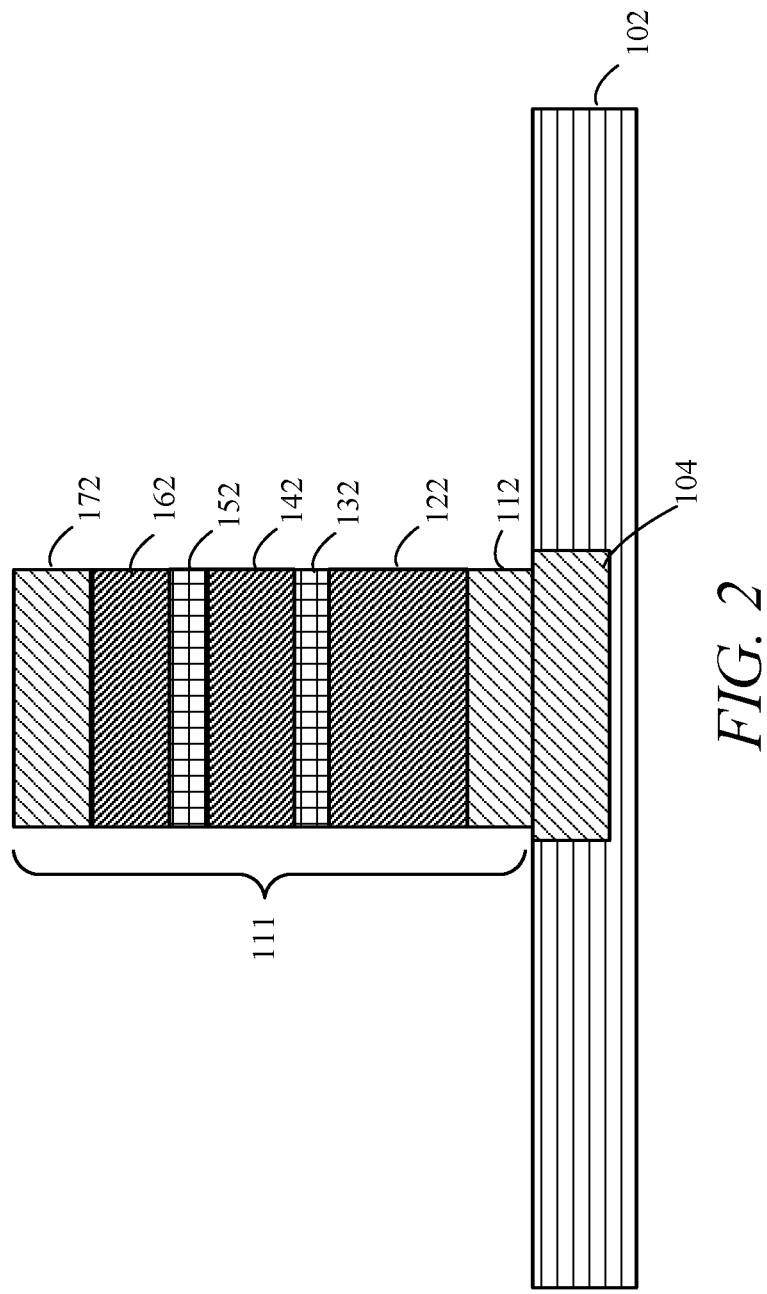

In FIG. 2, the cross-sectional view of FIG. 1 is updated to reflect the formation of the magnetoresistive device 111. In one embodiment, the formation is accomplished using a one-step etch that etches through the layers 170-110 using the hard mask 180 as a template to form the magnetoresistive device. As discussed in more detail below, in other embodiments, formation of the magnetoresistive device is accomplished using a plurality of etching steps, which, in some embodiments, are separated by encapsulation steps. In the embodiment illustrated in FIG. 2, the etching operation used to form the magnetoresistive device also removes the hard mask 180. Removal of the hard mask allows for electrical contact to be made to the magnetoresistive device by exposing the top electrode 172. In other embodiments, the hard mask 180 may be a conductive hard mask that need not be removed, whereas in yet other embodiments, some or all of the hard mask 180 is removed during other, subsequent etching steps or by polishing operations. An example of such an embodiment is illustrated in FIGS. 25-28, which is discussed in more detail below in conjunction with corresponding formation steps corresponding to the embodiment illustrated in FIGS. 1-8.

As shown in FIG. 2, the magnetoresistive device 111 includes a bottom electrode 112, lower magnetic material layer(s) 122, tunnel barrier 132, upper magnetic layer(s) 142, diffusion barrier 152, spacer layer(s) 162, and top electrode 172. Each of these features 112, 122, 132, 142, 152, 162, and 172 is formed be selectively removing portions of respective layers 110, 120, 130, 140, 150, 160, and 170. The etching used to form magnetoresistive device 111 may be accomplished using known or later developed techniques. One of ordinary skill in the art appreciates that the cross-sectional views are not drawn to scale and should not be viewed as representing proportional relationships between different layers. Rather the cross-sectional views are provided to help illustrate the processing steps performed by simplifying the various layers to show their relative positioning. For example, the hard mask layer 180 illustrated in FIG. 1 and shown to be removed in FIG. 2 may be three or more times as thick as the sum of the thicknesses of all of the underlying layers making up the device. Moreover, while the hard mask 180 is shown with straight 90-degree edges, in actuality such a layer may be more "rounded" and gradually sloping. In the embodiment illustrated in FIGS. 25-28, not all of the hard mask 180 is removed during formation of the magnetoresistive device 111. The remaining hard mask portion 182 is shown overlying the magnetoresistive device 111. As noted above, if the hard mask is non-conductive, it is later removed during the manufacturing process to expose the top electrode 172 and allow for electrical contact to the magnetoresistive device 111.

Figure 3:
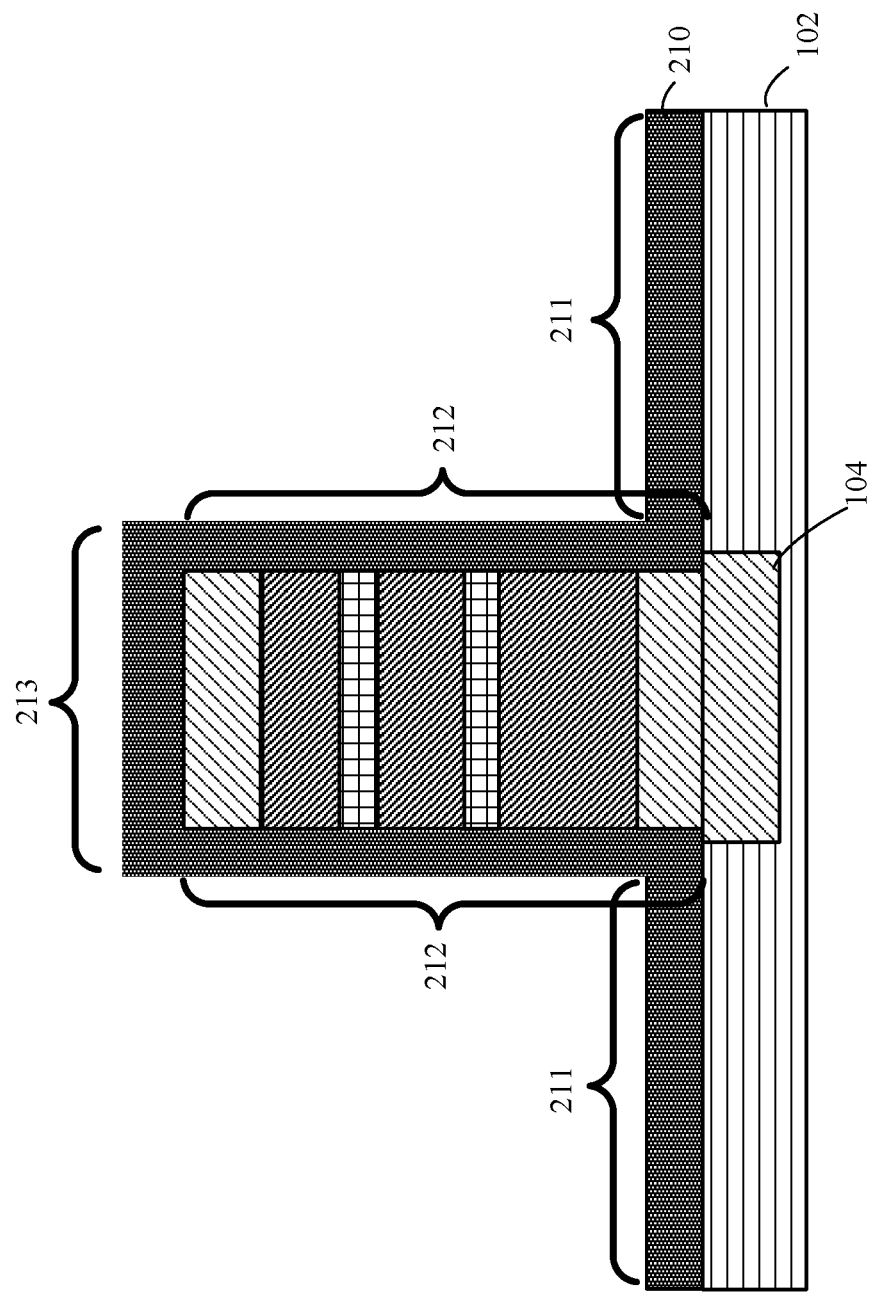
Figure 26:
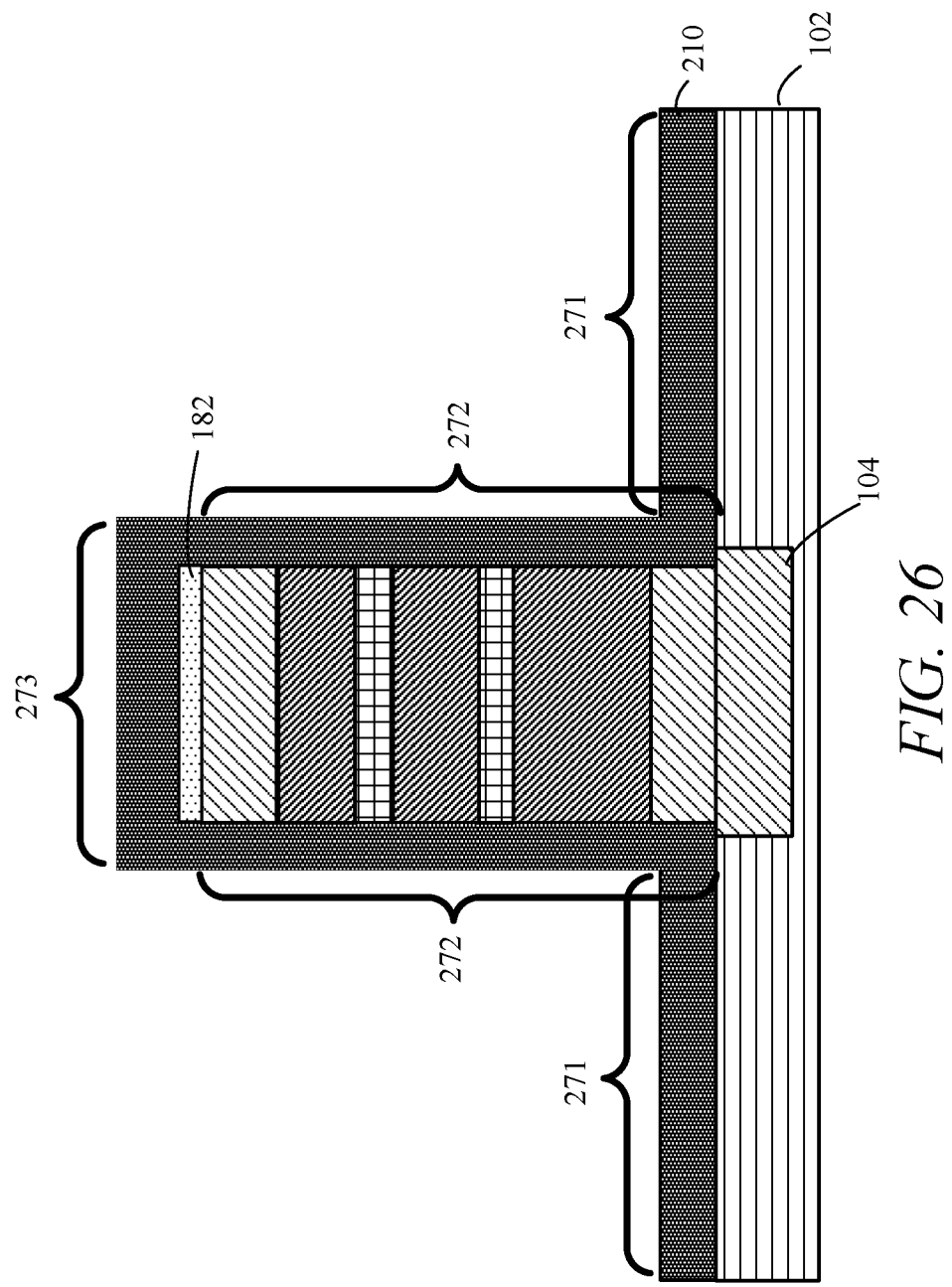

FIG. 3 shows the cross-sectional view of FIG. 2 following deposition of encapsulation material 210. The encapsulation material is deposited such that a first portion 211 of the encapsulation material 210 covers exposed portions of the underlying substrate, a second portion 213 covers exposed material on top of the magnetoresistive device (e.g. the top surface of the top electrode), and a third portion 212 covers the sidewalls of the magnetoresistive device. Note that the third portion 212 covers the entirety of the sidewalls, including the sidewalls of the bottom electrode 112. While FIG. 3 illustrates the encapsulating material as a generally uniform coating of material, it should be understood that it may be uneven and varying in thickness to some degree. FIG. 26 shows encapsulating material portions 271, 272, and 273 covering the magnetoresistive device 111 in an embodiment in which a hard mask portion 182 remains.

In some embodiments, the encapsulation material 210 is a layer of a silicon nitride such as $Si_3N_4$ that is deposited across the integrated circuit within which the magnetoresistive device 111 is included. In other embodiments, the encapsulation material 210 includes silicon nitride, a silicon oxide such as $SiO_2$, an aluminum oxide such as $Al_2O_3$, a magnesium oxide such as MgO, or other oxides, alone or in various combinations. In some example embodiments, the encapsulation material 210 is deposited using chemical vapor deposition (CVD), whereas in other embodiments, the encapsulation material 210 is deposited using atomic layer deposition. In some embodiments, the layer of encapsulation material has a thickness within a range of 5-40 nanometers, and a thickness of 10-25 nanometers is a preferable range for some example embodiments.

Figure 4:
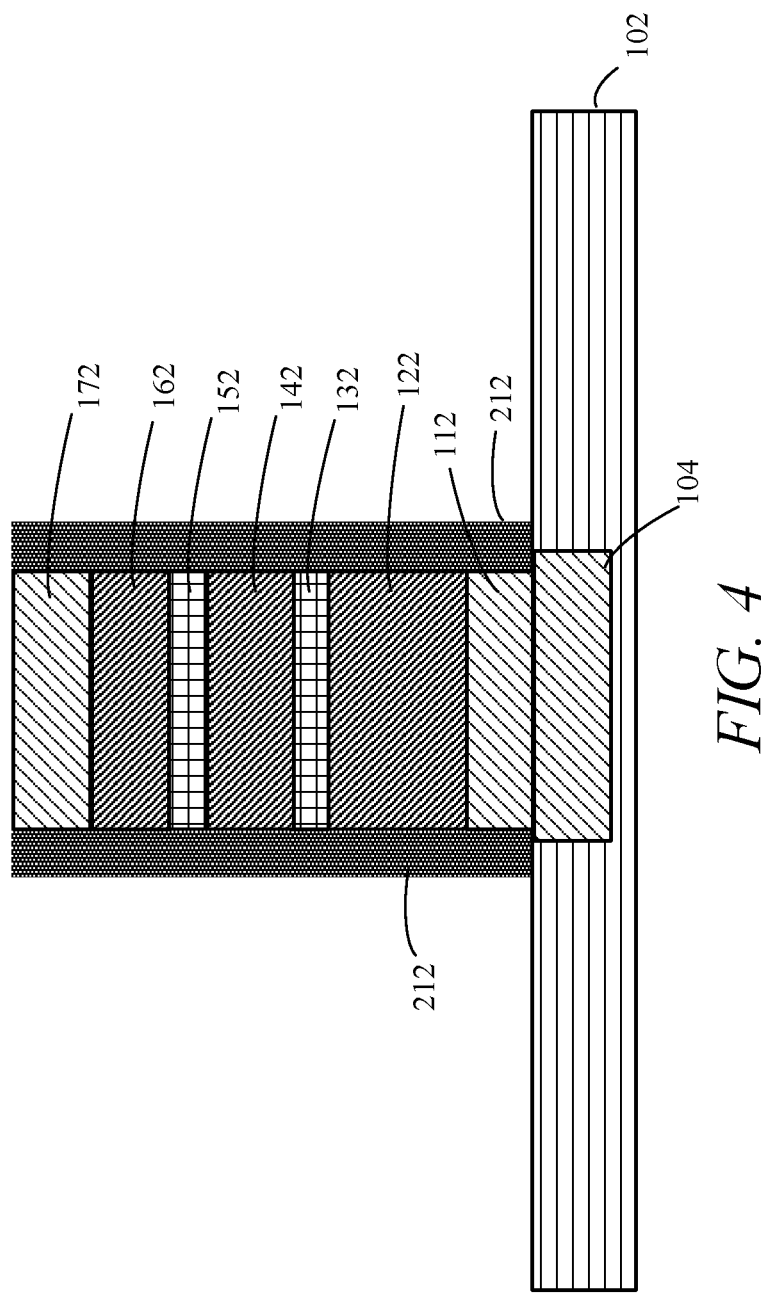
Figure 27:
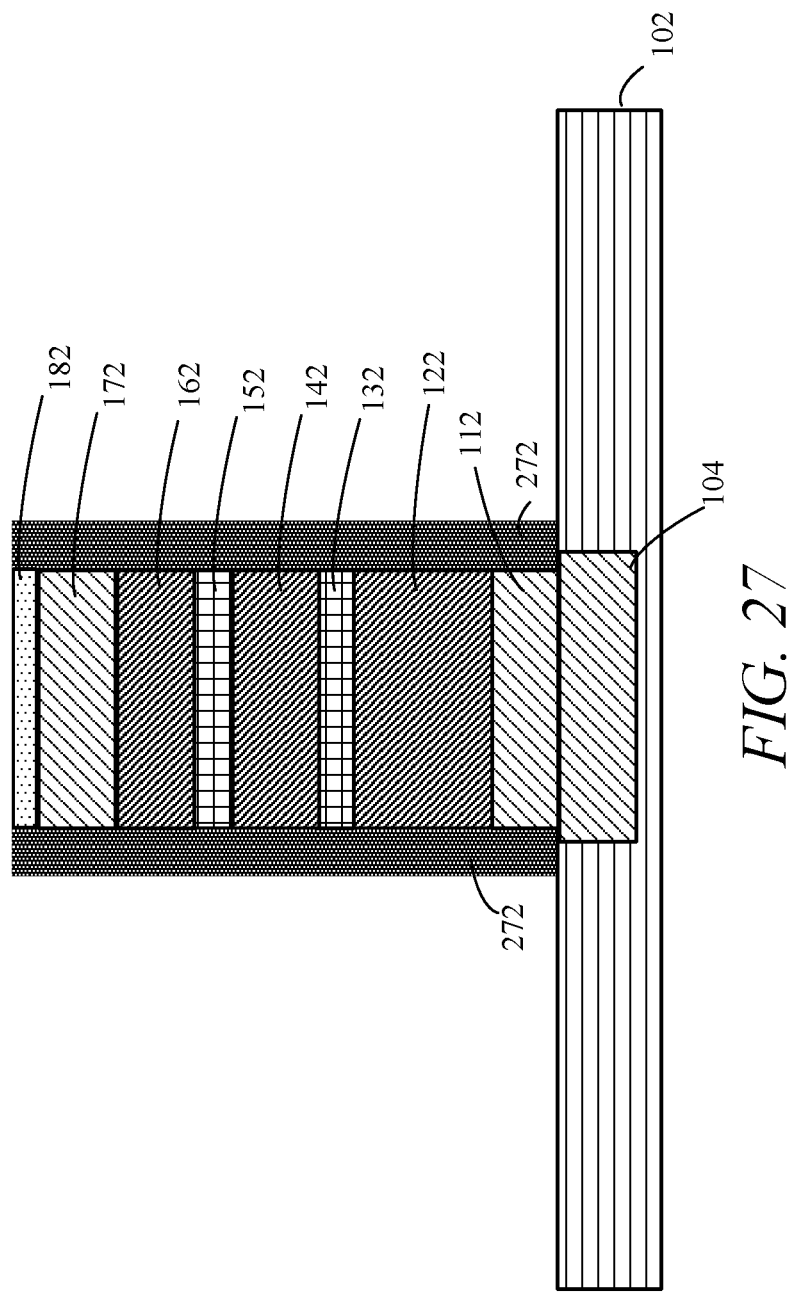

FIG. 4 shows the cross-sectional view of FIG. 3 following selective removal of portions of the encapsulation material 210. As shown in FIG. 4, the first portion of encapsulation material 211 covering the exposed portions of the underlying substrate has been removed as well as the second portion 213 covering the exposed material on top of the magnetoresistive device. The third portion 212 of the encapsulating material covering the sidewalls of the magnetoresistive device has been left in place. As shown in FIG. 4, the third portion 212 covers the entirety of the sidewalls of the magnetoresistive device. In other embodiments, the coverage of the third portion 212 is not complete or has variations in thickness. FIG. 27 illustrates similar removal of portions 271 and 273 of encapsulating material, while leaving encapsulating material 272 on the sidewalls of the embodiment in which a portion of the hard mask 182 remains on the top of the top electrode 172.

In some embodiments, removal of the first and second portions of the encapsulation material is accomplished by etching. In some example embodiments, an anisotropic etch is used to remove the horizontal components of the layer of encapsulating material while leaving vertical portions behind. A physical etch that bombards the encapsulation material is one example of an anisotropic etch that can be used to etch back the encapsulation material.

Figure 5:
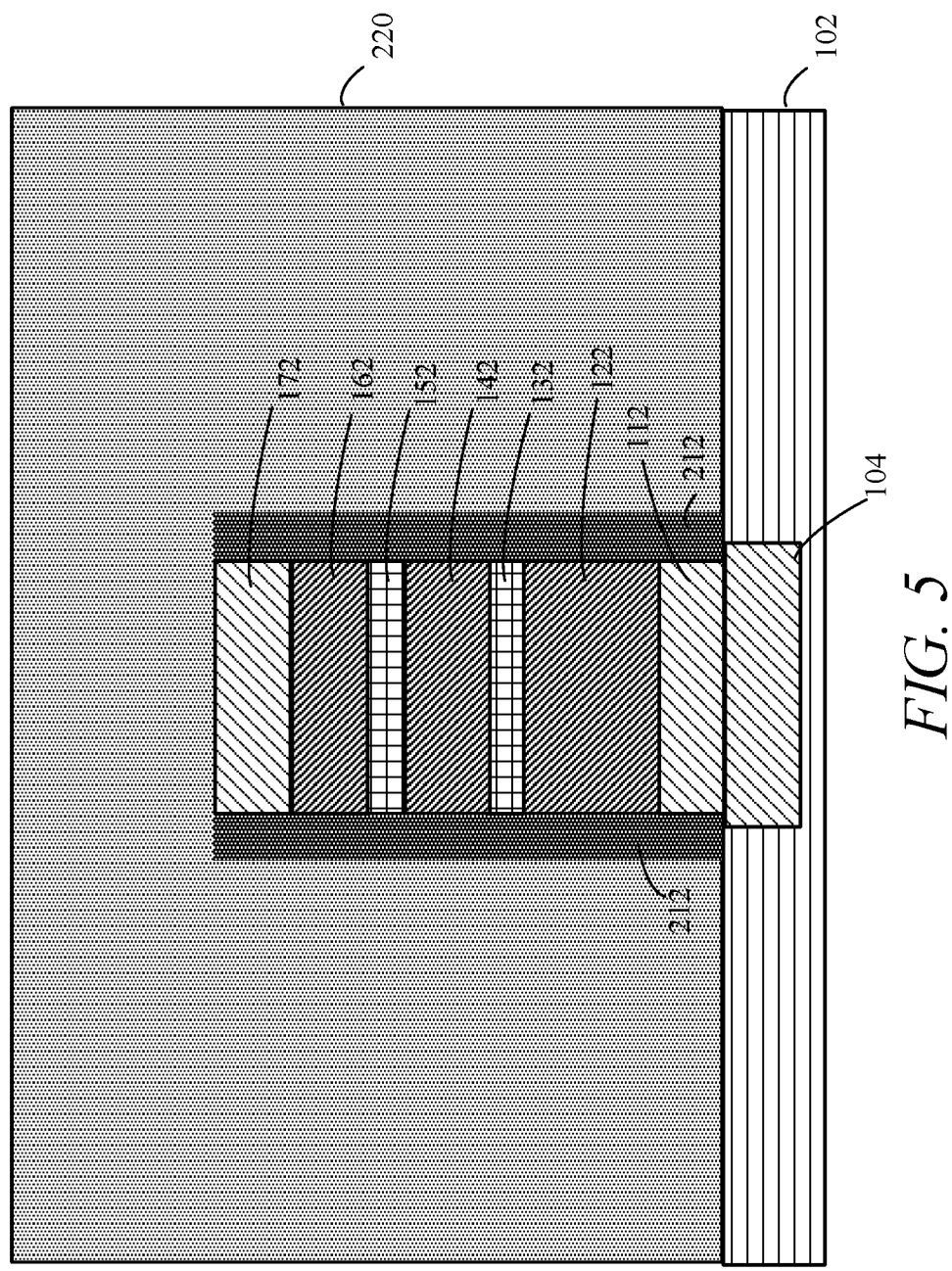
Figure 28:
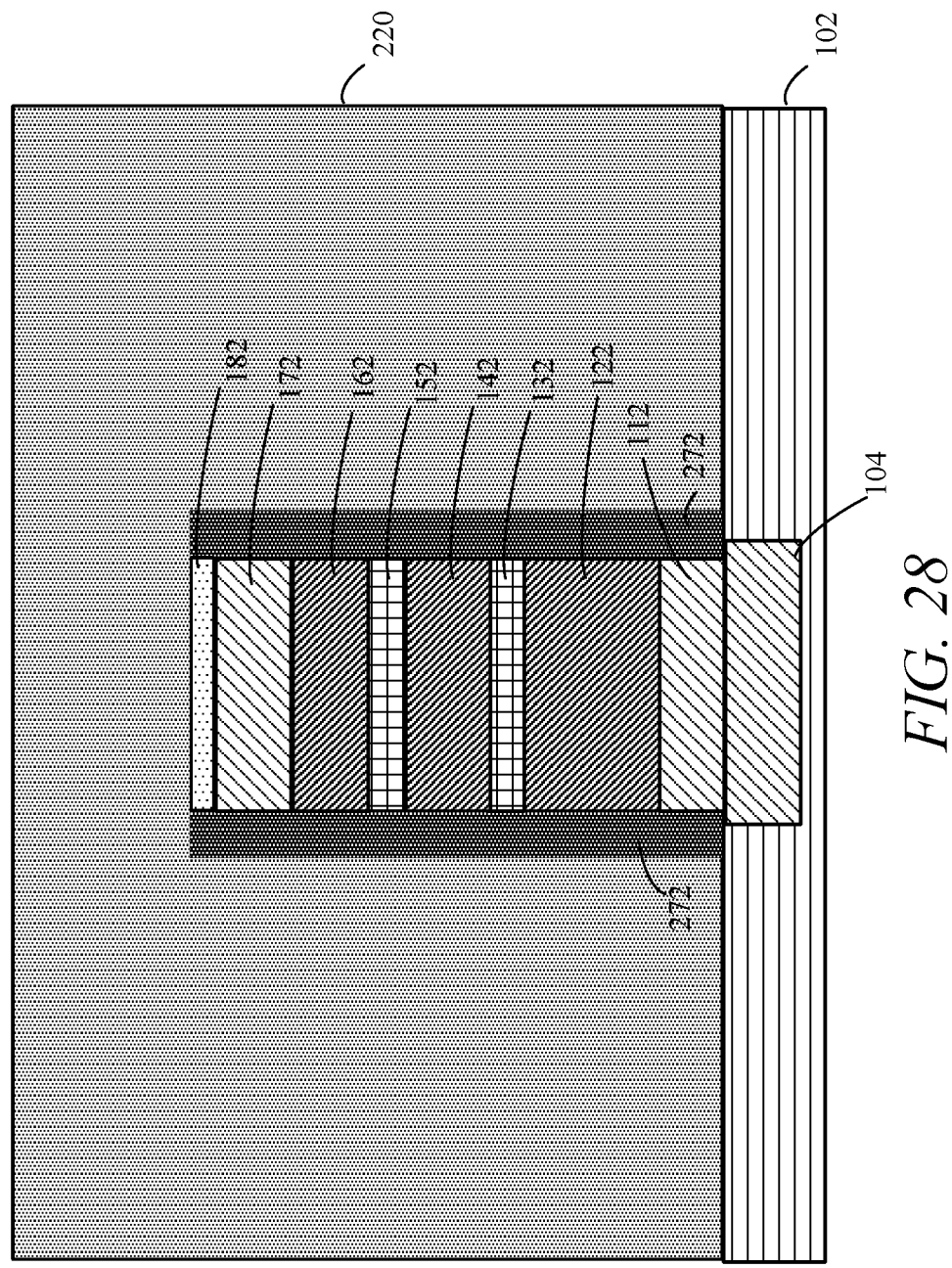

FIG. 5 shows the structure of FIG. 4 following the deposition of interlayer dielectric material 220 that covers the exposed portions of the underlying substrate 102 and the encapsulation material 212 covering the sidewalls of the magnetoresistive device. In some embodiments, interlayer dielectric material includes high-dielectric-constant (high-k) materials such as silicon dioxide or tetraethyl orthosilicate (TEOS), low-dielectric constant (low-k) materials such as SiCoH, or various combinations thereof that is deposited using chemical vapor deposition (CVD) or physical vapor deposition (PVD). As noted above, the deposition chemistry used to form the interlayer dielectric material 220 can have an adverse impact on one or more of the layers of the magnetoresistive device. For example, if exposed to the interlayer dielectric deposition, the tunnel barrier layer 132 may be degraded in a manner that impacts the electrical characteristics of the magnetoresistive device. As such, having encapsulation material 212 covering the sidewalls of the magnetoresistive device protects those layers from degrading during the deposition of the interlayer dielectric material 220. FIG. 28 shows the embodiment corresponding to FIG. 27 after deposition of interlayer dielectric material 220.

Figure 6:
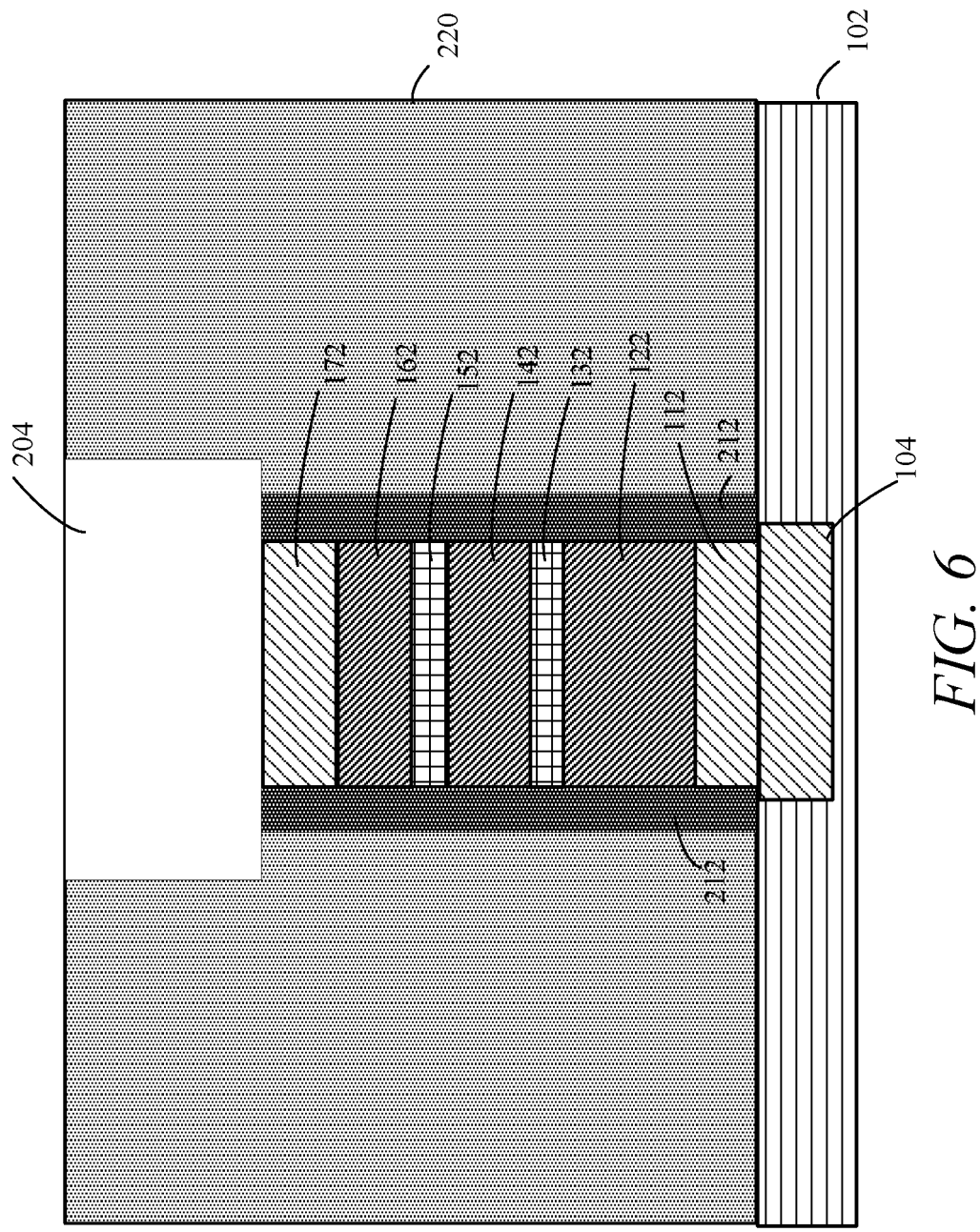

Turning to FIG. 6, a hole 204 is formed in the interlayer dielectric material 220. In some embodiments, the hole 204 is formed by patterning and etching as is well known in the art. The hole 204 provides access to the top electrode 172 of the magnetoresistive device such that electrical contact can be made to the top portion of the magnetoresistive device. As shown in FIG. 6, the hole 204 etched exposes a portion of the top electrode 172 corresponding to the top surface of the top electrode 172. In performing such etching, the top electrode 172 or the encapsulation material 212 may serve as an etch stop that prevents further etching or signals that the etching has reached a desired depth within the device structure. For example, a determination as to when to stop the etching process can be based on time or the detection of certain material from the top electrode 172 and/or the encapsulation material 212 in an optical emission spectrum.

In the embodiment corresponding to FIG. 28, etching to remove the interlayer dielectric material 220 above the top electrode 172 can also include etching to remove the remaining hard mask material 182. In some embodiments, such etching also removes portions of the encapsulation material 272 on the sidewalls of the hard mask material 182, whereas in other embodiments, the etching that removes the hard mask material 182 may be selective to the hard mask material such that some or all of the encapsulation material on the sidewalls of the hard mask material 182 is left behind. Once the hard mask material 182 is removed and the hole 204 for the contact is formed, the structure of FIG. 28 may correspond to that shown in FIG. 6. The etching used to form the contact hole 204 may include multiple etching steps using different etching chemistries and etching conditions. For example, a first etch chemistry may be used to selectively remove the interlayer dielectric material while a second etch chemistry is used to remove the hard mask material.

In other embodiments, after deposition of the interlayer dielectric material 220 in FIG. 28, a polishing (e.g. chemical mechanical polishing (CMP)) step can be used to remove the hard mask material 182, the encapsulation material on the sidewalls of the hard mask material 182, and the interlayer dielectric material 220 lying above the top electrode 172. Following the polishing step, additional interlayer dielectric material can be deposited over the structure. A contact hole is then formed in the additional interlayer dielectric material deposited in order to provide access to the top electrode 172, thereby resulting in a structure such as that illustrated in FIG. 6.

Figure 7:
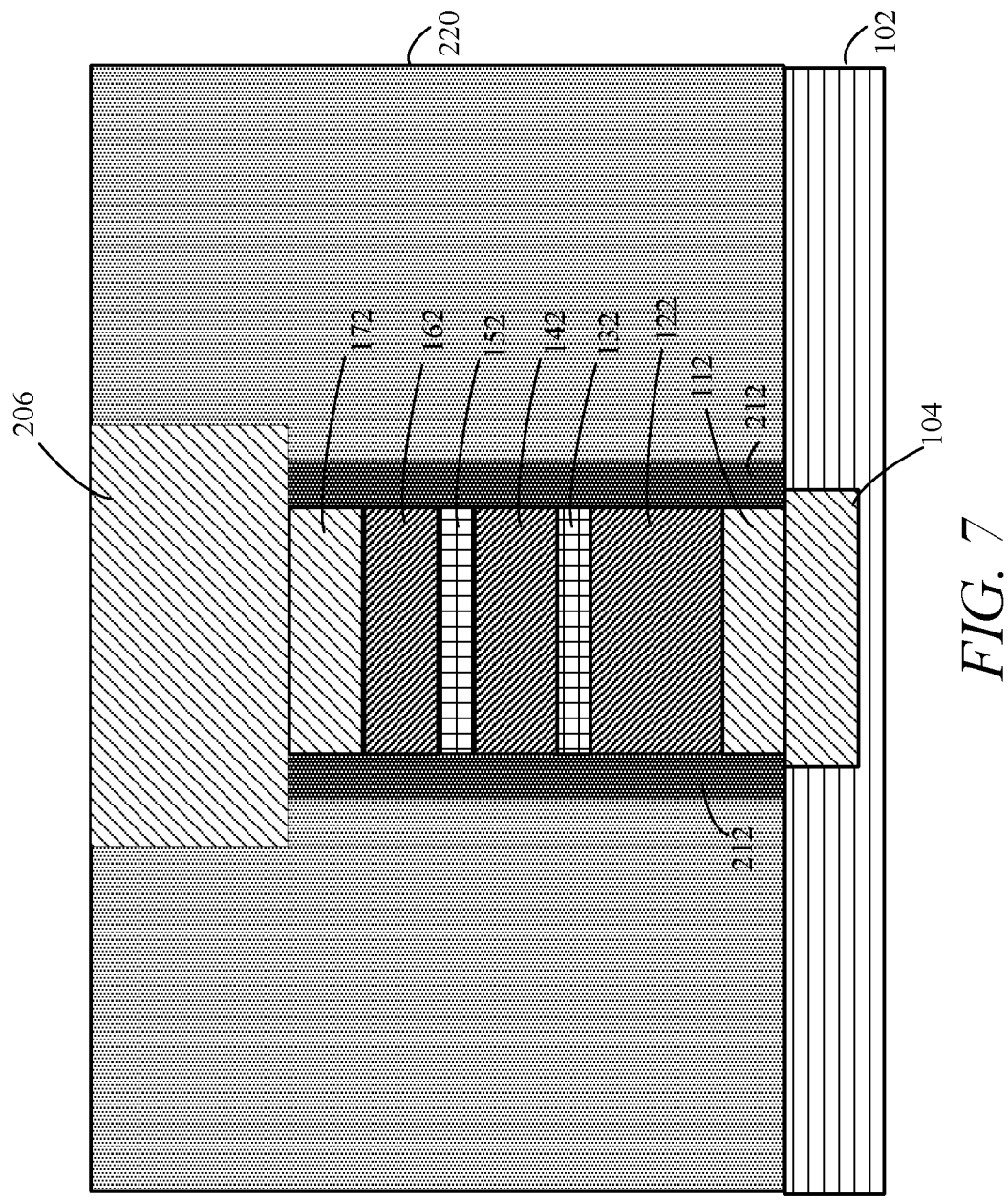

As shown in FIG. 7, deposition of conductive material in the hole 204 results in a top contact or via 206 that is electrically coupled to the top electrode 172. Note that in other embodiments, the top electrode 172 of the magnetoresistive device may be directly coupled to a signal line on the integrated circuit such as, for example, a bit line in an MRAM array. While FIG. 7 shows the top contact or via 206 to be larger in width than the underlying magnetoresistive device and encapsulation, in other embodiments, the via 206 is small in width. Thus, the top contact or via 206 may have a larger or smaller footprint, or area measurement in the horizontal plane, than the underlying magnetoresistive device. Also, whereas the top contact or via 206 is shown to be generally centered over and on the magnetoresistive device, in other embodiments, the via 206 is offset such that only a portion of the top electrode 172 is directly contacted by the via 206.

Figure 8:
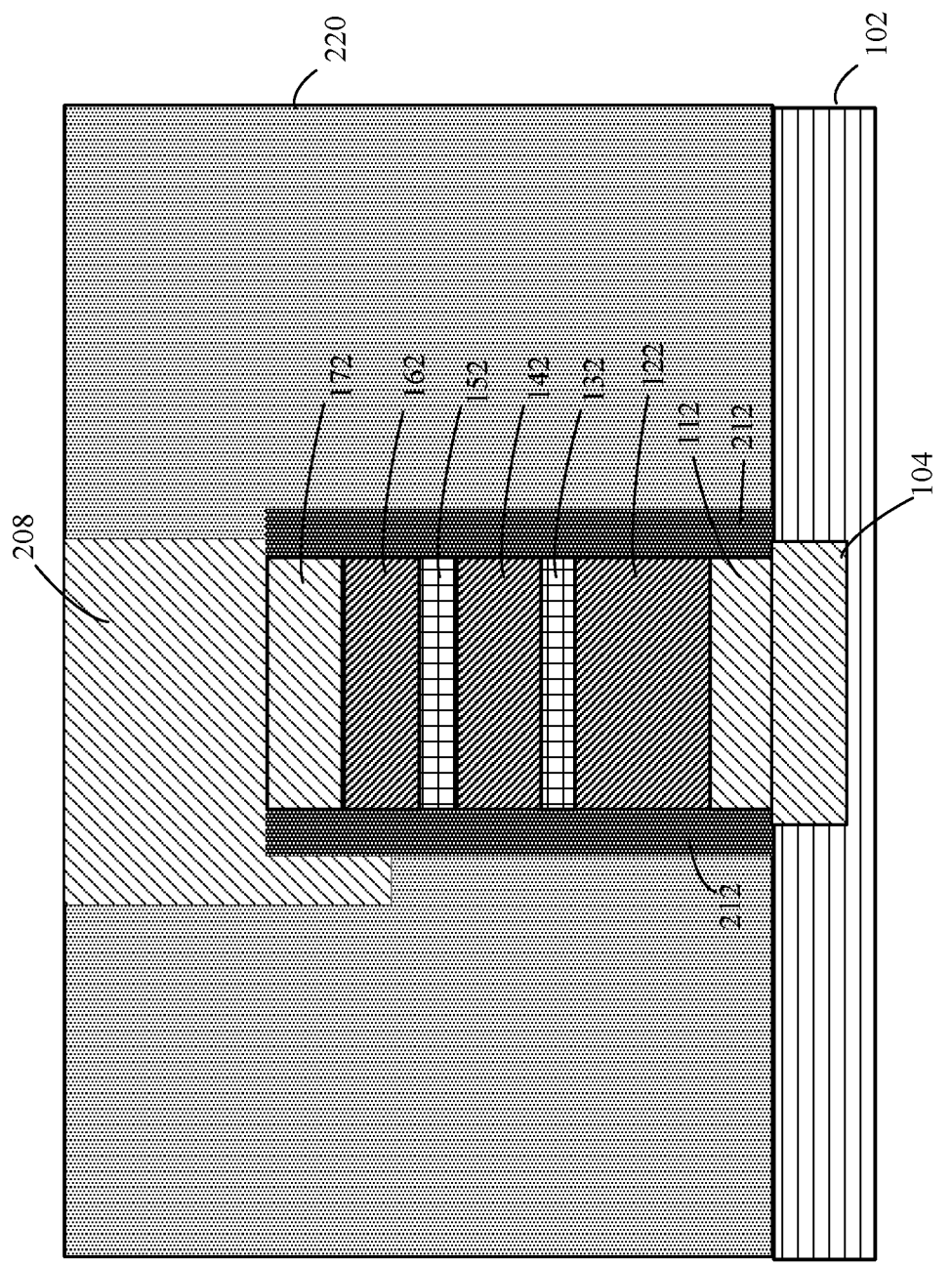

FIG. 8 shows an embodiment in which a top contact or via 208 is formed, where the via 208 extends below the top electrode 172. The over-extension of the via 208 may be due to imprecise etching of the hole for the via 208 or based on the need for the etching that forms the hole for via 208 to continue in order to enable proper formation of features in other aspects of the integrated circuit on which the magnetoresistive device is included. For example, the same etching used to form via 208 may be used to form vias or other contacts in a logic portion of the integrated circuit, where such vias or contacts need to extend deeper into the interlayer dielectric material in those portions of the integrated circuit. Etching the hole for via 208 preferably uses an etching chemistry that is selective to the interlayer dielectric material such that the interlayer dielectric material is selectively removed in comparison to the encapsulating material. In such embodiments, the interlayer dielectric material 220 is removed more quickly than any removal of encapsulating material such that at least some of the encapsulating material between the hole and the magnetoresistive device remains.

As shown in FIG. 8, a portion of the encapsulation material 212 lies between a portion of the via 208 and the layers of the magnetoresistive stack. Because the encapsulation material is insulating, it prevents the via 208 from contacting the spacer layer 162, which could result in an unwanted short circuit that would compromise device functionality. While FIG. 8 shows the via 208 only extending to a depth corresponding to spacer layer 162, in other embodiment, the via 208 may extend much deeper such that the encapsulation layer 212 prevents unwanted short circuits between the via 208 and any or all of layers 162, 152, 142, 132, 122, and 112.

Figure 9:
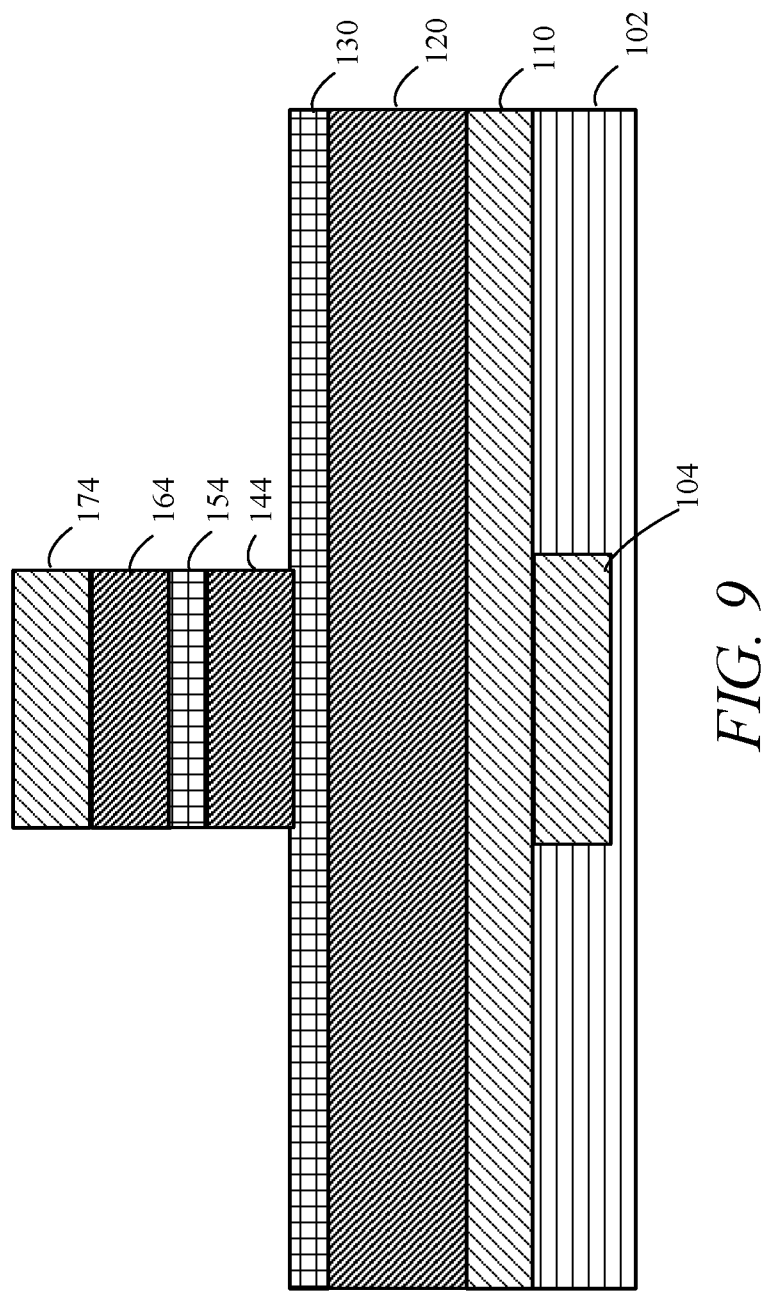
FIGS. 9-18 illustrate cross-sectional views of layers included in a magnetoresistive device during different stages of the manufacturing of a magnetoresistive device in accordance with another exemplary embodiment.

FIGS. 2-8 correspond to an embodiment in which the entire magnetoresistive device is etched using a single-step etch. FIGS. 9-18 correspond to an alternate embodiment in which the magnetoresistive device is formed using a two-step etch process. It should be appreciated that the magnetoresistive device may be formed using any number of etching and encapsulation steps, and then encapsulation following device formation can be used to protect the fully-formed device from degradation during the following deposition of interlayer dielectric material. FIG. 9 corresponds to the cross-sectional view depicted in FIG. 1 following a first etching step in which the hard mask 180 is used as a template. The first etching step forms the top electrode 174, spacer layer 164, diffusion barrier 154, and top magnetic layers 144. In the embodiment depicted in FIG. 9, the hard mask 180 is removed during this first etching step. As noted above, in other embodiments the hard mask material is removed during later processing steps such as, for example, during the removal of encapsulation material or during the formation of a hole corresponding to a via used to contact the top electrode 174.

As shown in FIG. 9, etching the plurality of layers corresponding to the magnetoresistive device includes etching a first portion of the plurality of layers to form an etched first portion of the magnetoresistive device that includes device layers 144, 154, 164, and 174. In the embodiment illustrated the first portion of the magnetoresistive device includes the top electrode 174 and the free layer(s) 144. As shown in FIG. 9, the first etching step stops at the top surface of the layer 130, which, when later etched during the second etching step, forms the tunnel barrier for the magnetoresistive device. In other embodiments, the set of layers etched during the first etching step is may include more layers or fewer layers than the set of layers shown in FIG. 9. For example, the set of layers etched during the first etching step may include etching the layer 130 corresponding to the tunnel barrier for the device.

Figure 10:
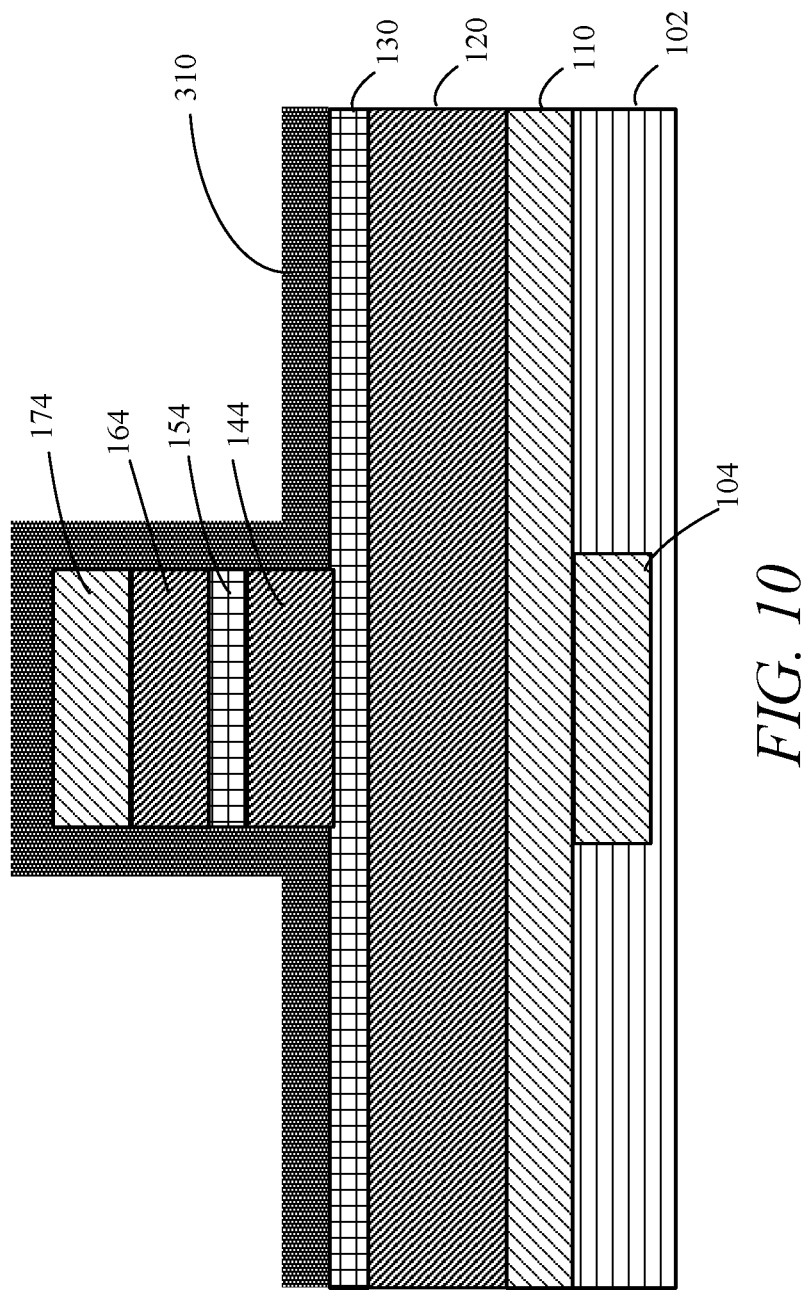
Figure 11:
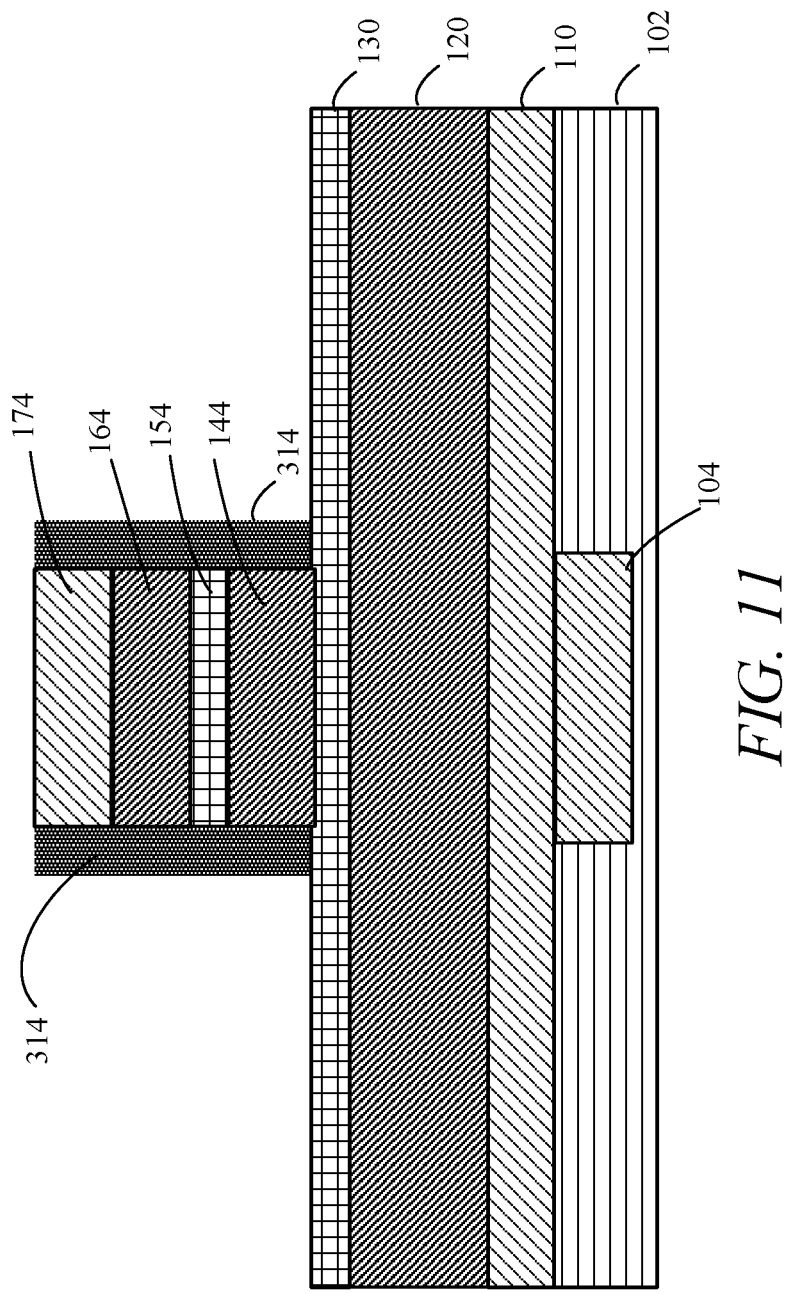

In order to protect the device layers 144, 154, 164, and 174, those layers can be encapsulated prior to subsequent etching steps used to form the remaining portion of the magnetoresistive device. FIG. 10 shows the structure illustrated in FIG. 9 following deposition of encapsulating material 310. Following deposition of the encapsulating material 310, an etch back or other removal process can be used to strip the remove the encapsulating material from the surface of layer 130 as well as the top surface of the top electrode 174. The resulting structure is depicted in FIG. 11. As shown in FIG. 11, encapsulation material 314 is left residing on the sidewalls of the first portion of the magnetoresistive device formed during the first etching step. In other embodiments, rather than depositing the layer of encapsulating material 310 and etching back, encapsulation of the first portion of the magnetoresistive device can be accomplished by exposing those device layers to oxidizing or nitridizing gas such that a controlled reaction occurs to form the encapsulation.

Figure 12:
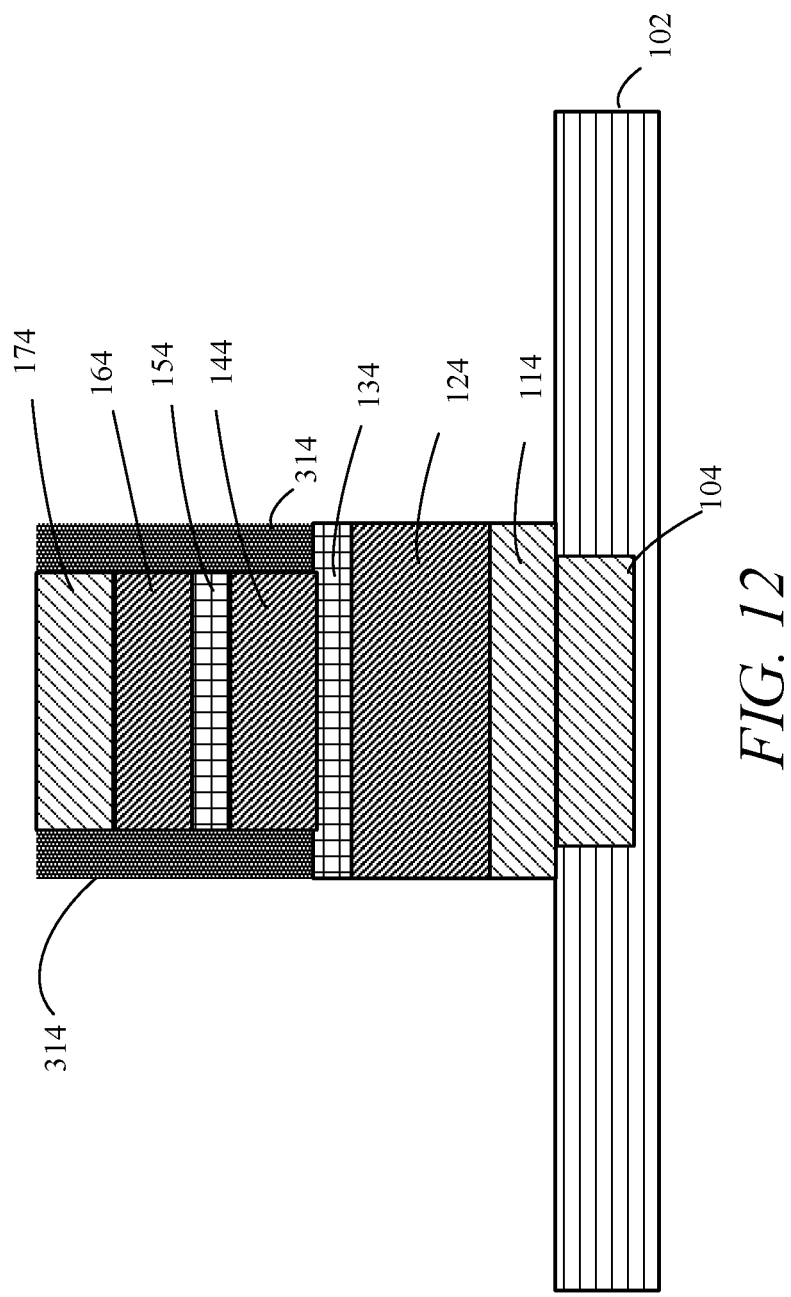

FIG. 12 illustrates the cross-sectional view of FIG. 11 following the second etching step used to fully define the magnetoresistive device. The etching performed corresponding to FIG. 12 does not require an additional masking step (i.e. deposition and patterning of hard mask material), but instead relies on the partially formed magnetoresistive device structure as the template for the second etching step. Thus, the top electrode 174 and encapsulation material 314 act as a template for the etching of layers 110, 120, and 130 in order to form magnetoresistive device layers 114, 124, and 134. Such an etching step may be referred to as a self-aligned etch. Note that the chemistry used during the second etching step may be corrosive with respect to any or all of layers 144, 154, 164, and 174, and, as such, the encapsulation material 314 protects those layers during the second etching step. As shown in FIG. 12, etching the second portion of the plurality of layers to form the etched second portion of the magnetoresistive device includes formation of the tunnel barrier 134 and the fixed layer(s) 124.

Figure 13:
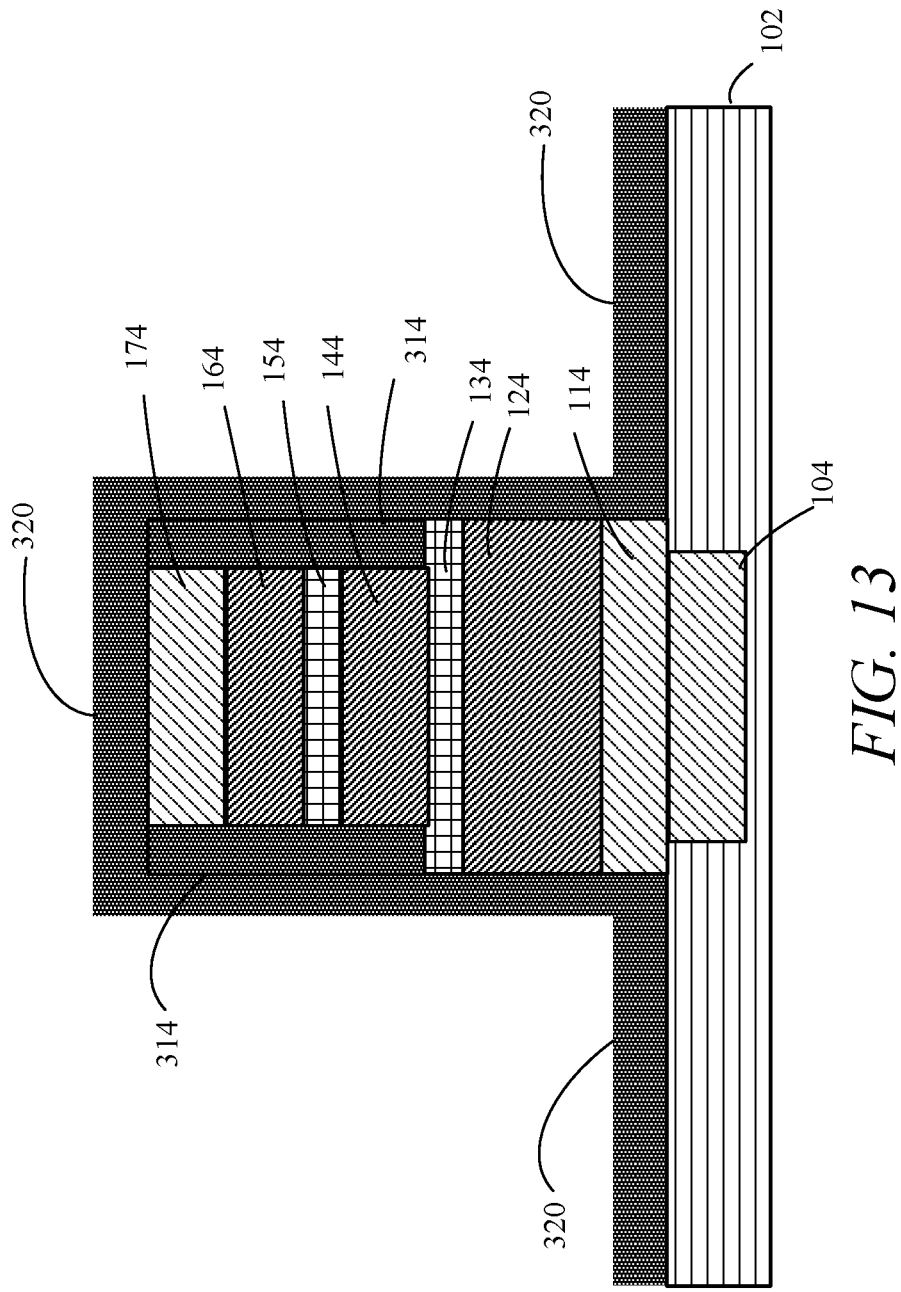

After the formation of the magnetoresistive device is complete as is shown in FIG. 12, further encapsulation of the entire device prior to interlayer dielectric material deposition helps to ensure that none of the layers within the magnetoresistive device are adversely affected by the conditions present during interlayer dielectric material deposition. As shown in FIG. 13, a layer of encapsulation material 320 is deposited across the exposed portions of the integrated circuit on which the magnetoresistive device is formed. The deposition of the encapsulation material 320 is similar to the deposition of encapsulation material 210 shown and described with respect to FIG. 3 above. Thus, the material in encapsulation material 320 can be the same types of materials described in the formation of encapsulation material 210 in FIG. 3, and the deposition of the encapsulation material 320 may be accomplished using the same techniques described with respect to the encapsulation material 210. As shown in FIG. 13, a portion of the layer of encapsulating material 320 is positioned along the sidewalls of the magnetoresistive device, where the sidewalls of the device include the remaining portions of encapsulating material 314 that were used to protect the first portion of the magnetoresistive device during the second etching step. The encapsulation material 320 also covers the sidewalls of layers 114, 124, and 134. Thus, the sidewalls of the magnetoresistive device are covered in their entirety by the layer of encapsulation material 320.

In some embodiments, the encapsulation material included in layer 320 is the same material as the material used for the encapsulation of the first portion of the magnetoresistive device. Thus, the material in regions 314 320 may be the same material (e.g. silicon nitride) such that a continuous layer of that material abuts the sidewalls of the entire magnetoresistive device structure, where a thicker portion of that continuous layer corresponds to the upper portion of the magnetoresistive device formed during the first etching step. In other embodiments, different encapsulation materials can be used such that encapsulation material 314 is different than encapsulation material 320. For example, the encapsulation material 314 may have better protection characteristics with respect to the etching step used to form the second portion of the magnetoresistive device, whereas the encapsulation material 320 is formulated to better protect the entire magnetoresistive device structure from the environment present during interlayer dielectric material deposition.

Figure 14:
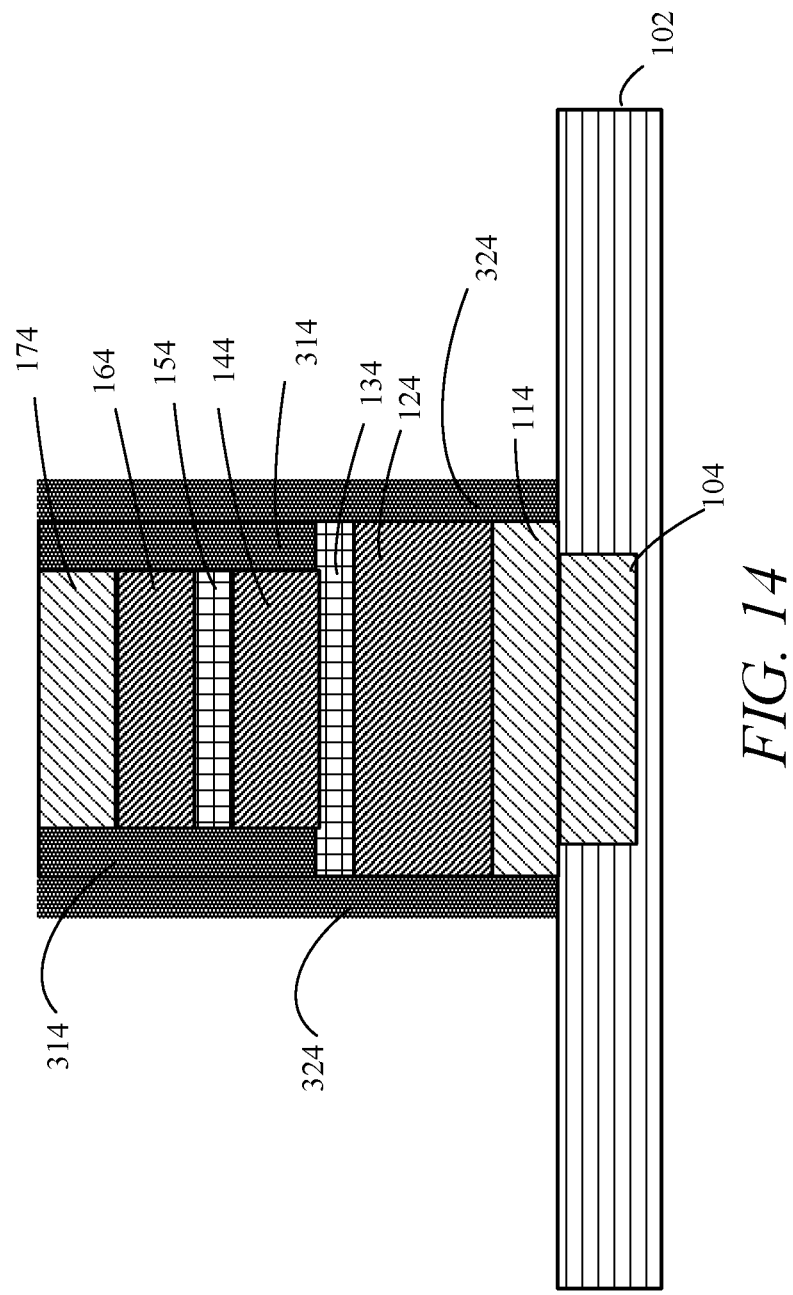

Following deposition of the layer of encapsulating material 320, an etch back is used to remove the portions of the layer of encapsulating material 320 other than those covering the sidewalls of the magnetoresistive device. As noted above, when the magnetoresistive device is included on an integrated circuit with other circuitry such as logic circuits, the etch back preferably removes the encapsulating material from those portions of the integrated circuit in which the logic circuits are present. FIG. 14 illustrates the magnetoresistive device structure having the remaining portion of layer 320, which is shown as material 324, disposed along the entirety of the sidewalls of the magnetoresistive device.

Figure 15:
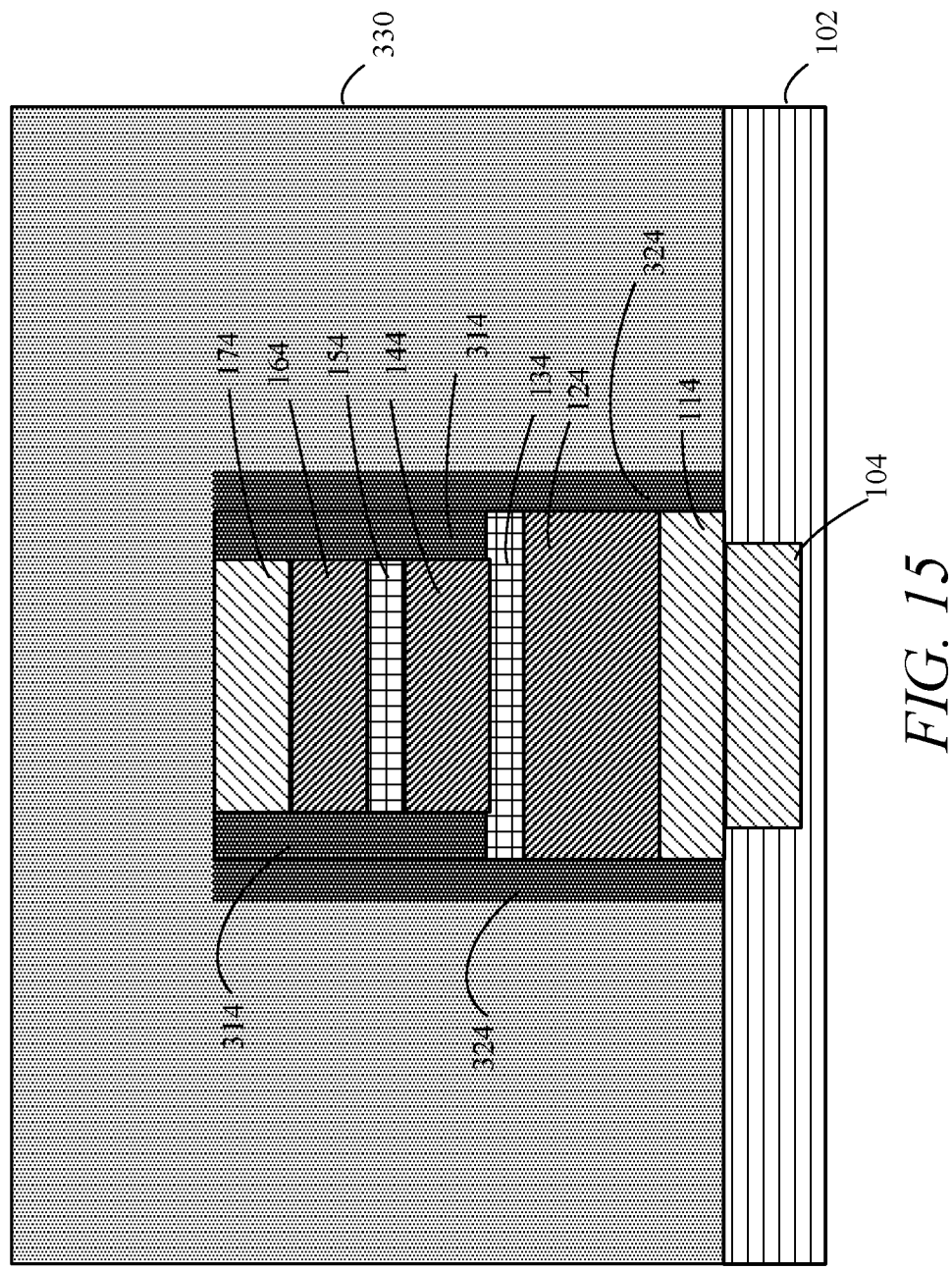
Figure 16:
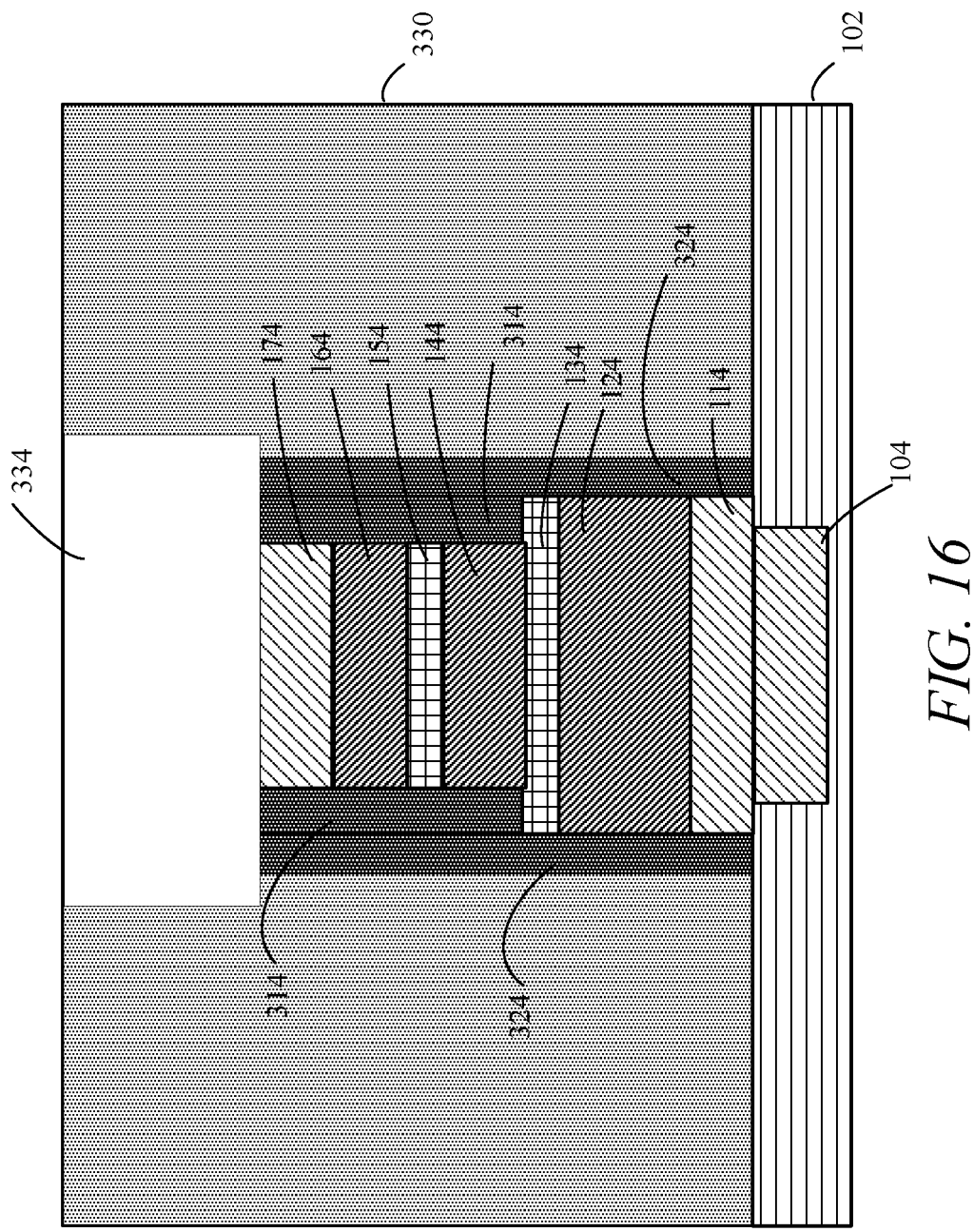

Following the etch back that removes portions of the encapsulating material in layer 320, interlayer dielectric material 330 is deposited as shown in FIG. 15. The encapsulation material 324 disposed along the sidewalls of the magnetoresistive device protects the various layers within the magnetoresistive device during the interlayer dielectric material deposition. Following formation of the interlayer dielectric material 330, a hole 334 is etched into the interlayer dielectric material 330 as shown in FIG. 16. This is similar to the formation of the hole for the top contact or via as discussed above with respect to FIGS. 6-8. In the formation of the hole 334, the encapsulation material 314 and 324 may serve as an etch stop, thereby helping to control the etching such that it does not extend deeper into the interlayer dielectric material 330.

Figure 17:
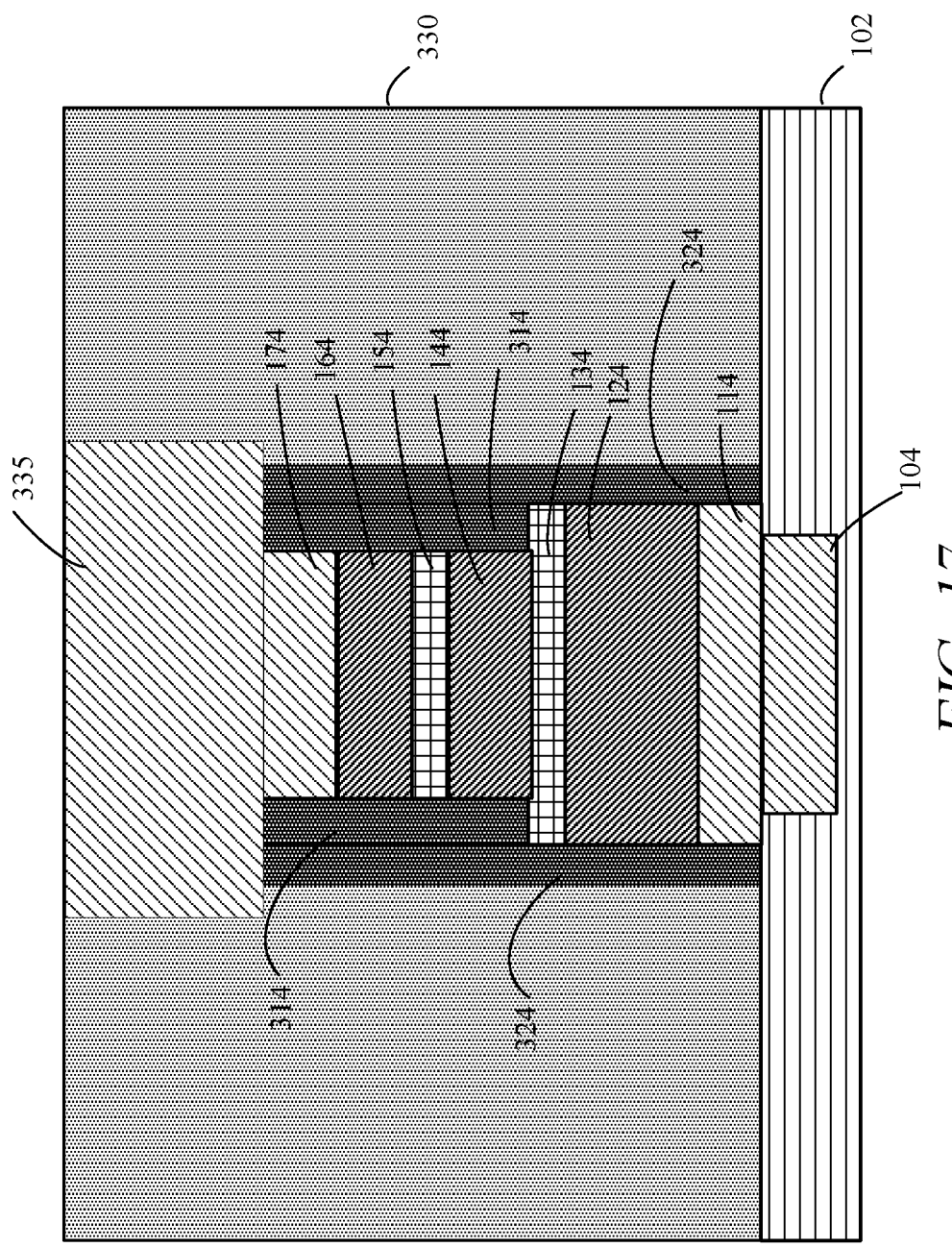
Figure 18:
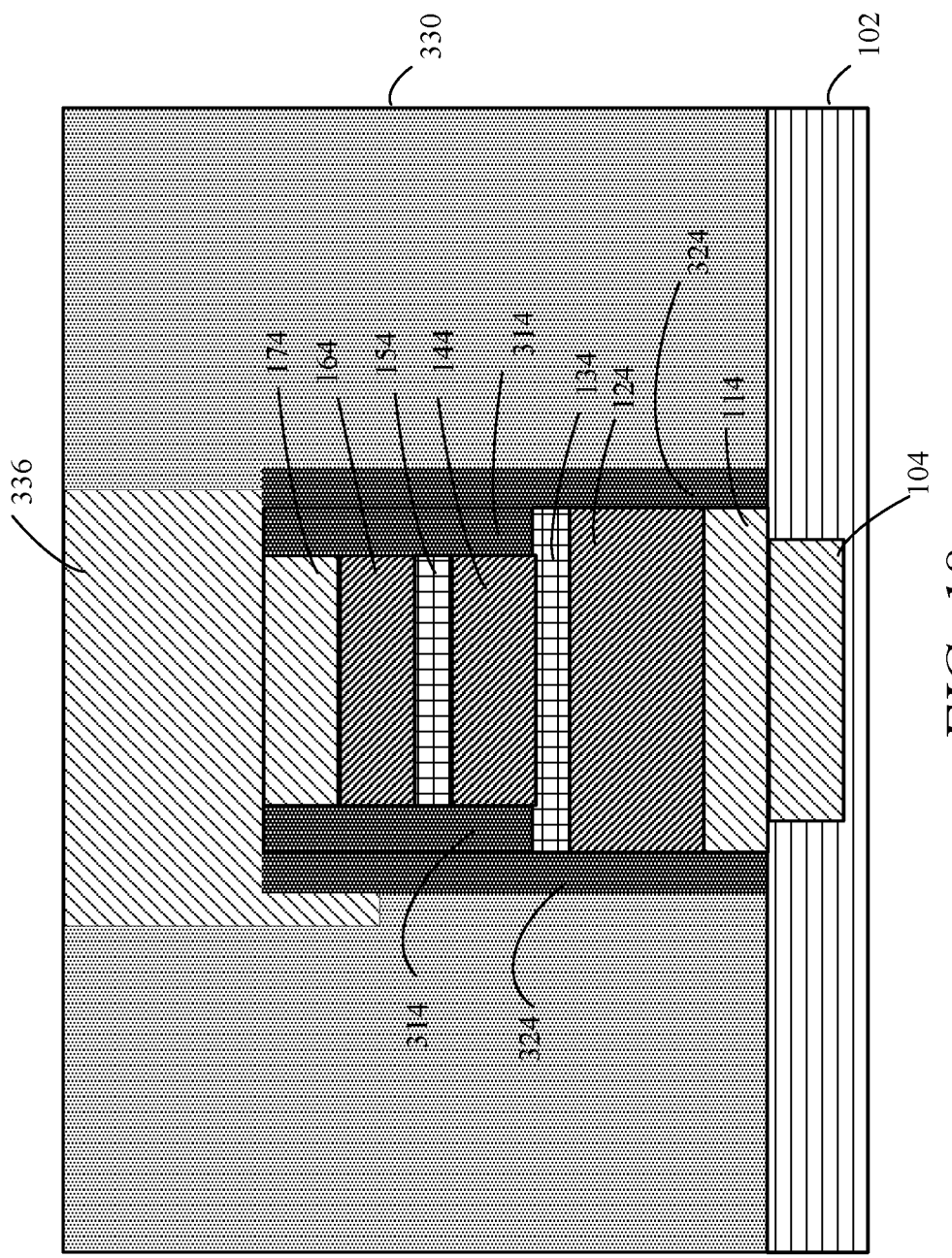

As shown in FIG. 17, following formation of the hole 334, conductive material is deposited within the hole 334 to form a top contact or via 335. FIG. 18 corresponds to an alternate embodiment in which the top contact or via 336 extends below the top electrode 174. In such an alternate embodiment, the encapsulation material 314 and 324 also protects the magnetoresistive device from unwanted short circuits as was discussed above with respect to FIGS. 6-8.

Figure 19:
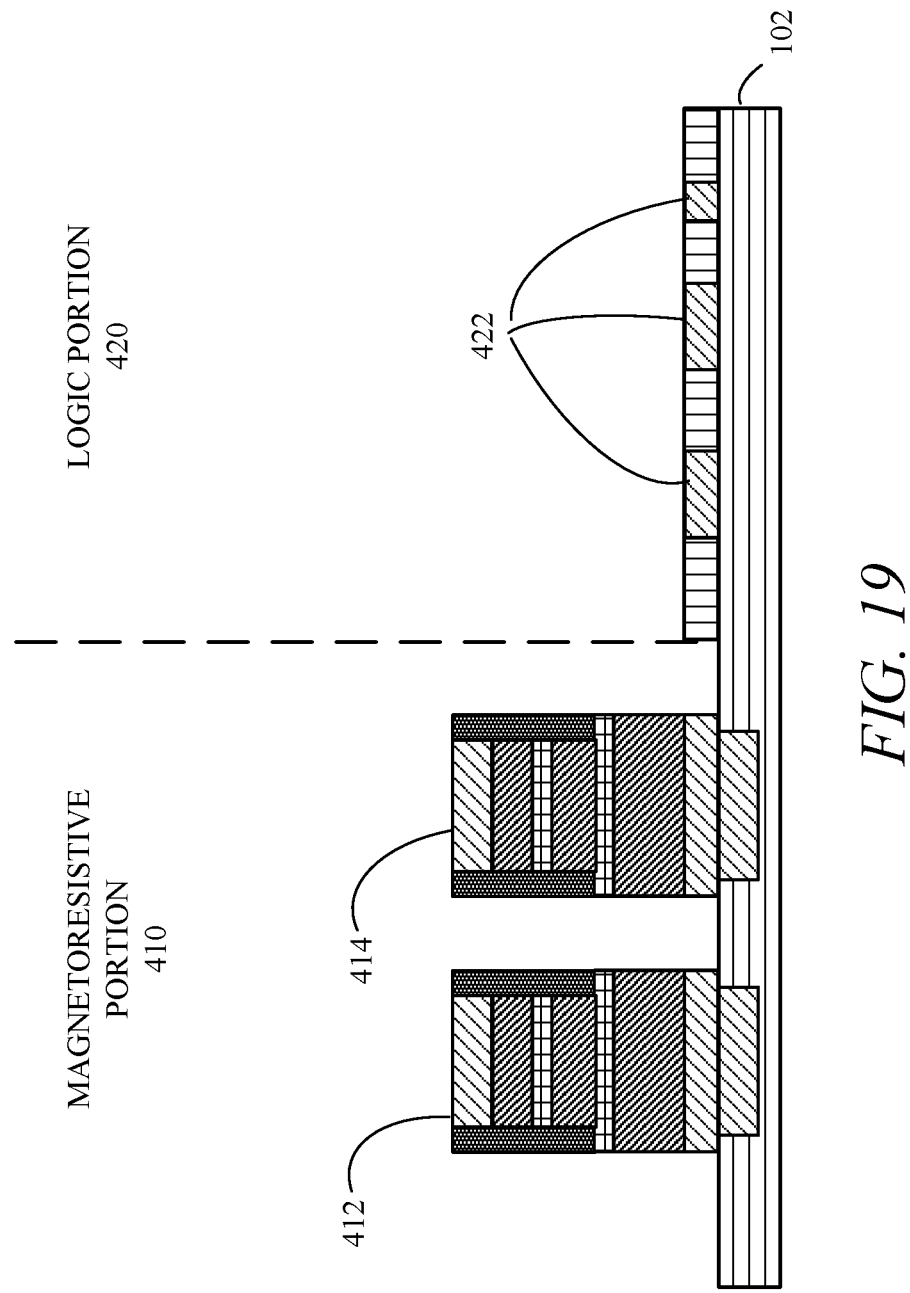
FIGS. 19-22 illustrate cross-sectional views of layers included in a magnetoresistive device during different stages of the manufacturing of a magnetoresistive device in accordance with yet another exemplary embodiment.

FIG. 19 illustrates a cross-sectional view of a portion of an integrated circuit, where the integrated circuit includes a magnetoresistive portion 410 and a logic portion 420. The magnetoresistive portion 410 includes magnetoresistive devices 412 and 414, where the logic portion 420 includes logic circuitry 422. In the example shown in FIG. 19, formation of the magnetoresistive devices 412 and 414 is complete, whereas the logic circuitry 422 may or may not be fully formed. Formation of the logic circuitry may precede formation of the magnetoresistive devices 412 and 414, may occur after formation of the magnetoresistive devices 412 and 414, or the processing steps for the two portions of the integrated circuit may be interleaved such that formation of the devices in each portion is ongoing at the same time. In some embodiments, some of the steps used in forming the magnetoresistive devices 412 and 414 may also be used to produce portions of the logic circuitry 422 included in the logic portion 420. In some embodiments, magnetoresistive devices 412 and 414 are magnetic memory cells included in an array of magnetic memory cells on the integrated circuit along with the logic circuitry 422. A particular example embodiment corresponds to an embedded-MRAM embodiment in which an embedded MRAM array is included with processing circuitry or other logic circuitry on the same integrated circuit (i.e. chip or die).

Figure 20:
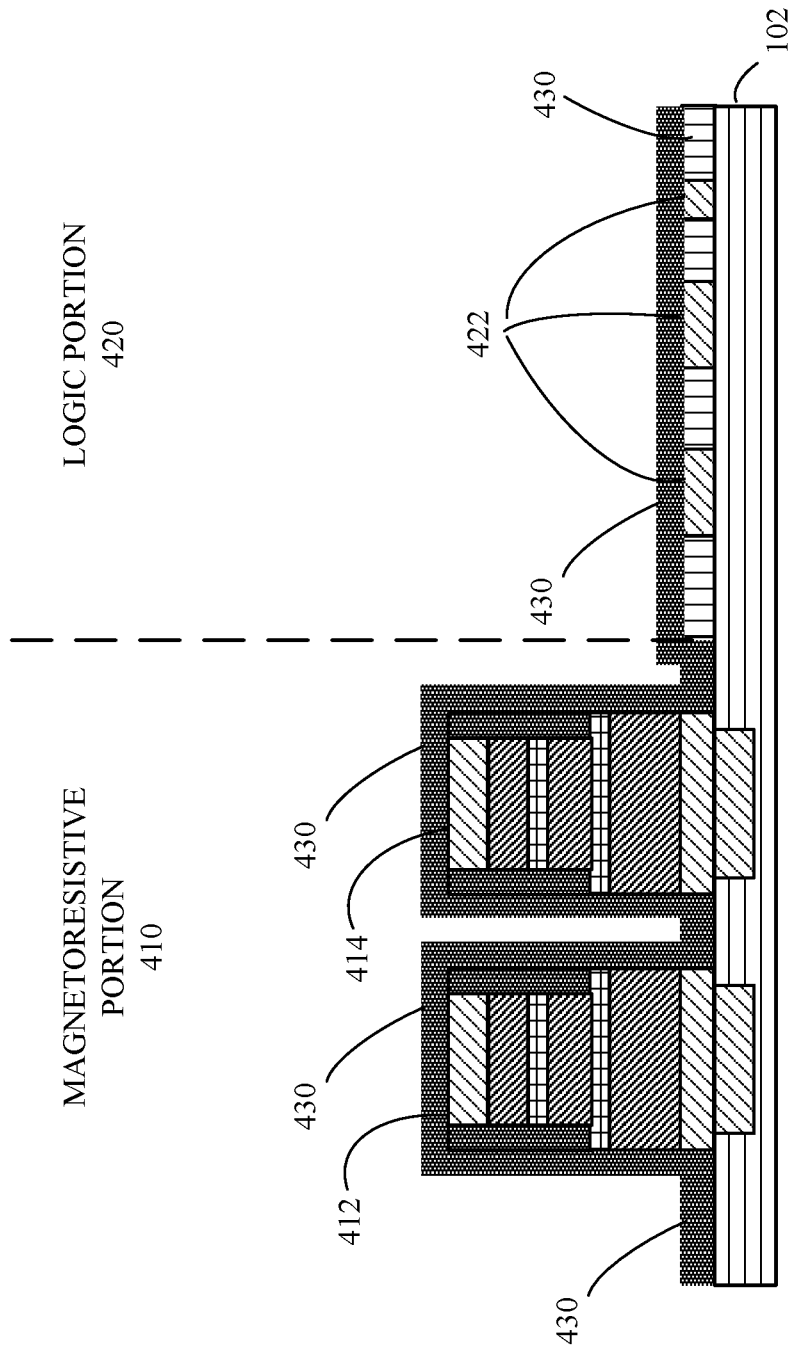

Once the magnetoresistive devices 412 and 414 are fully formed, a layer of encapsulation material 430 is deposited on the integrated circuit as shown in FIG. 20. The layer of encapsulation material 430, which in one embodiment is silicon nitride, covers all of the exposed portions of the integrated circuit. As such, a portion of the layer of encapsulating material 430 covers the exposed portions of the substrate 102 in the magnetoresistive portion 410 as well as any exposed portions of the substrate 102 in the logic portion 420. Similarly, the tops and sidewalls of the magnetoresistive devices 412 and 414 are also covered by the layer of encapsulating material 430. Finally, the exposed portions of the logic circuitry 422 and surrounding features are also covered by the layer of encapsulation material 430.

Figure 21:
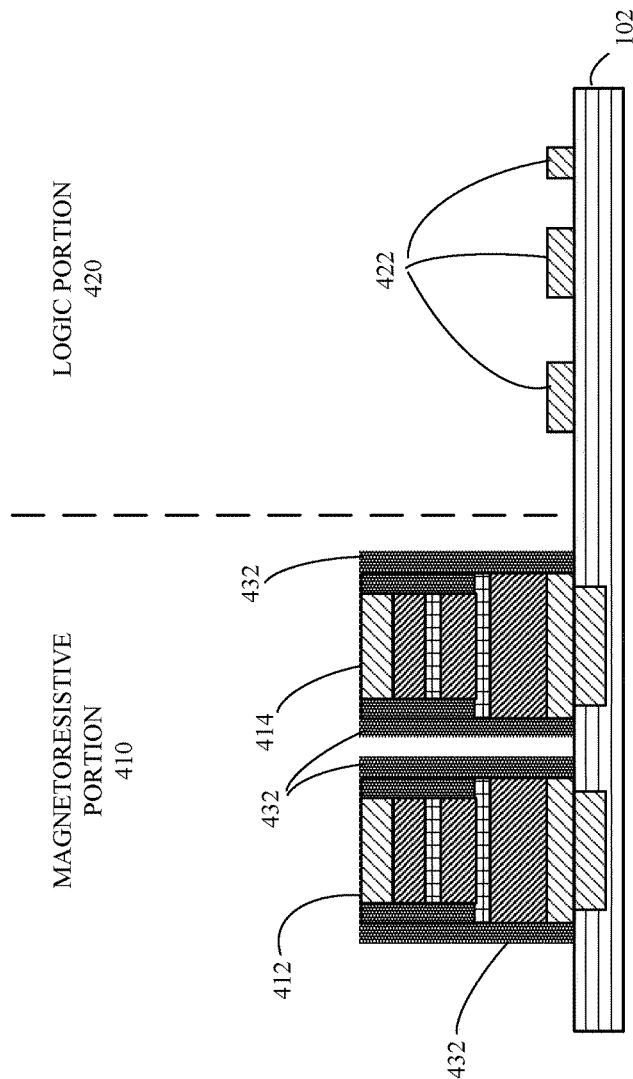
Figure 22:
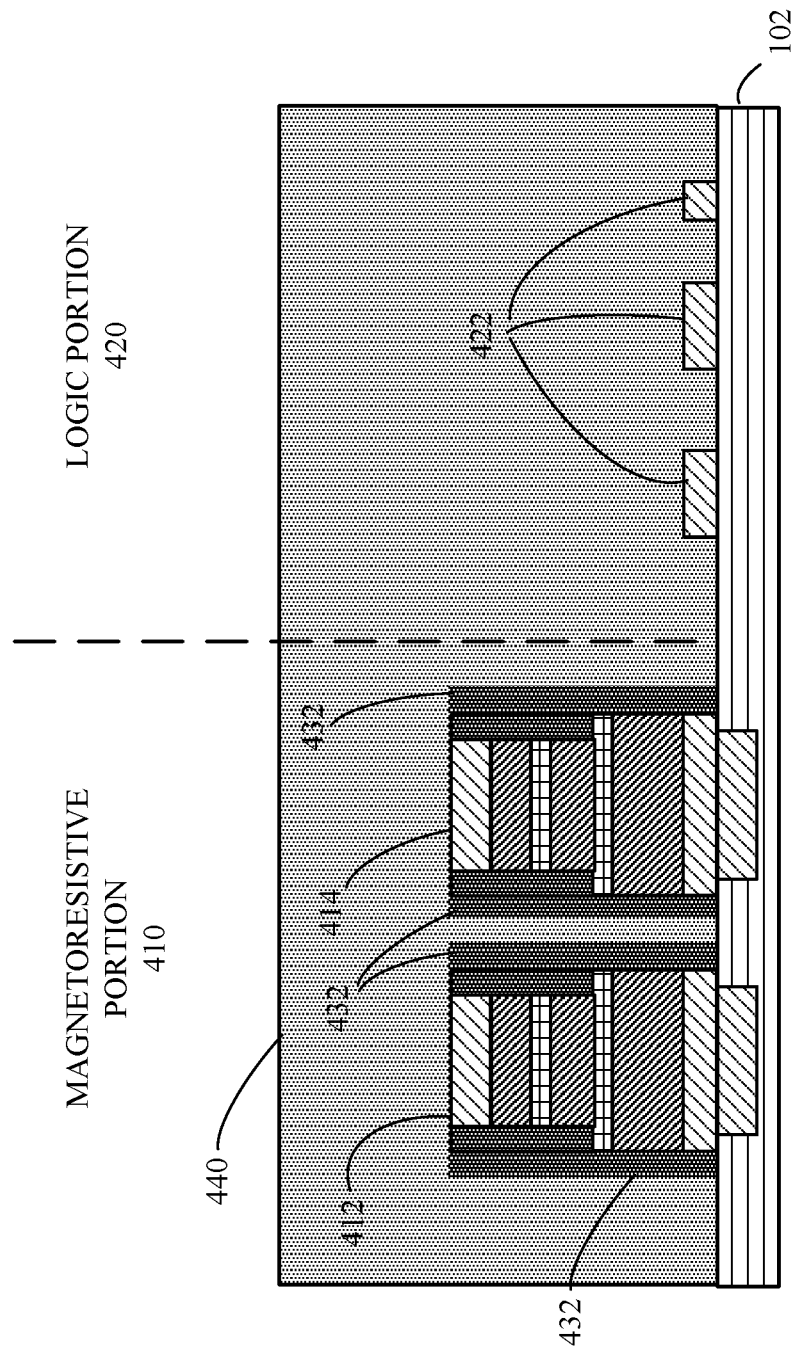

Turning to FIG. 21, a cross-sectional view corresponding to FIG. 20 following an etch back operation is illustrated. The etch back operation removes all portions of the layer of encapsulation material 430 other than those corresponding to the sidewalls of the magnetoresistive devices 412 and 414. The remaining portion 432 of the layer of encapsulating material covers the entirety of the sidewalls of the magnetoresistive devices, thereby providing protection for the magnetoresistive devices during subsequent deposition of the interlayer dielectric material. FIG. 22 illustrates the deposition of the interlayer dielectric material 440, where the interlayer dielectric material 440 surrounds the magnetoresistive devices 412 and 414, thereby providing separation between those devices and other devices included on the integrated circuit. Interlayer dielectric material 440 also covers the logic circuitry 422 and logic portion 420. After deposition of the interlayer dielectric material 440, vias or top contacts can be formed within the interlayer dielectric material 440 in order to permit access to the top portions of the magnetoresistive devices 412 and 414. Similarly, the interlayer dielectric material 440 can be etched or otherwise removed within the logic portion 420 of the integrated circuit in order to allow for connective traces, contacts, or other features to be formed within the logic portion 420 of the integrated circuit.

Figure 23:
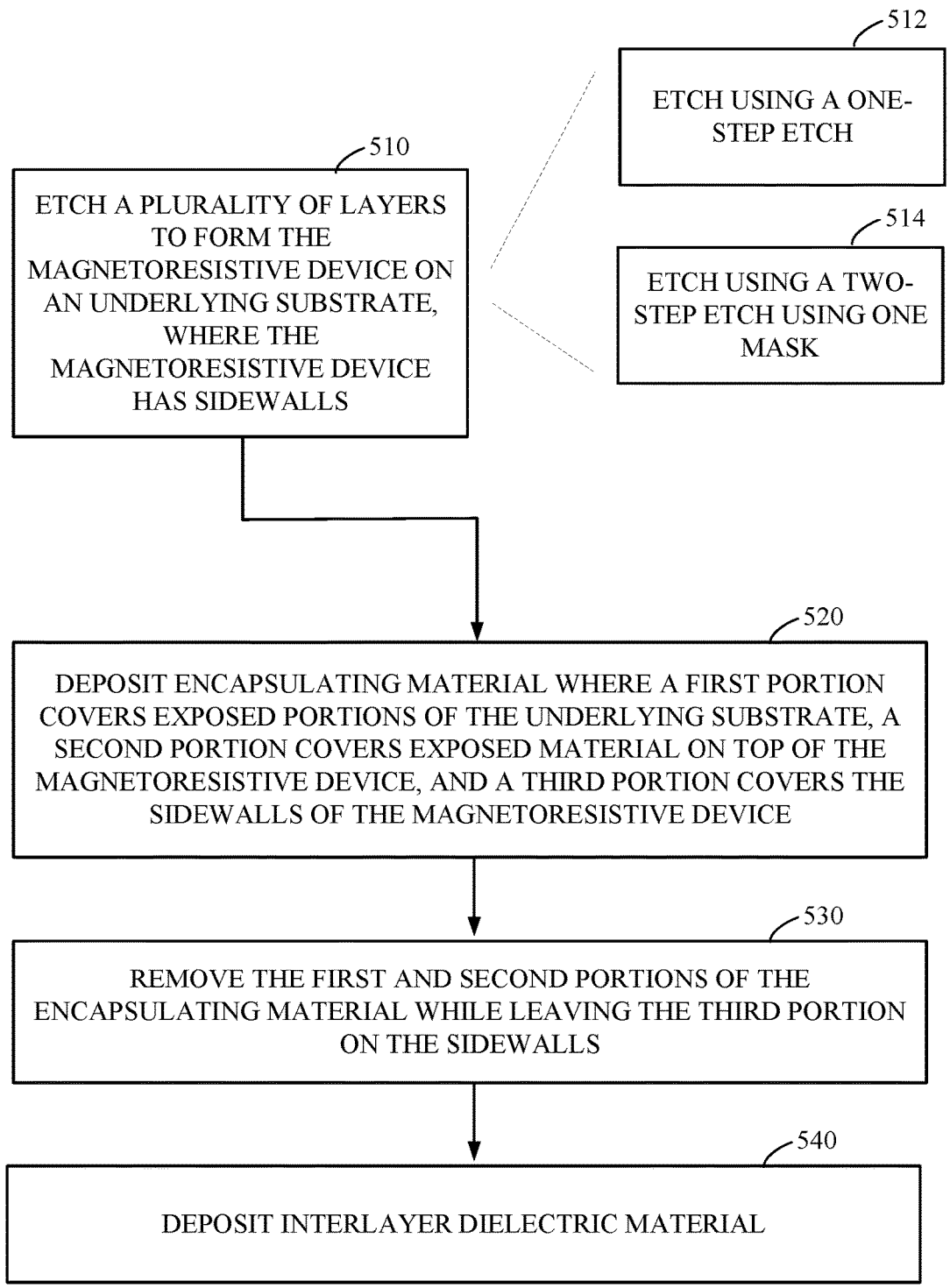
FIGS. 23-24 are flow charts of methods of manufacturing a magnetoresistive device in accordance with exemplary embodiments.
Figure 24:
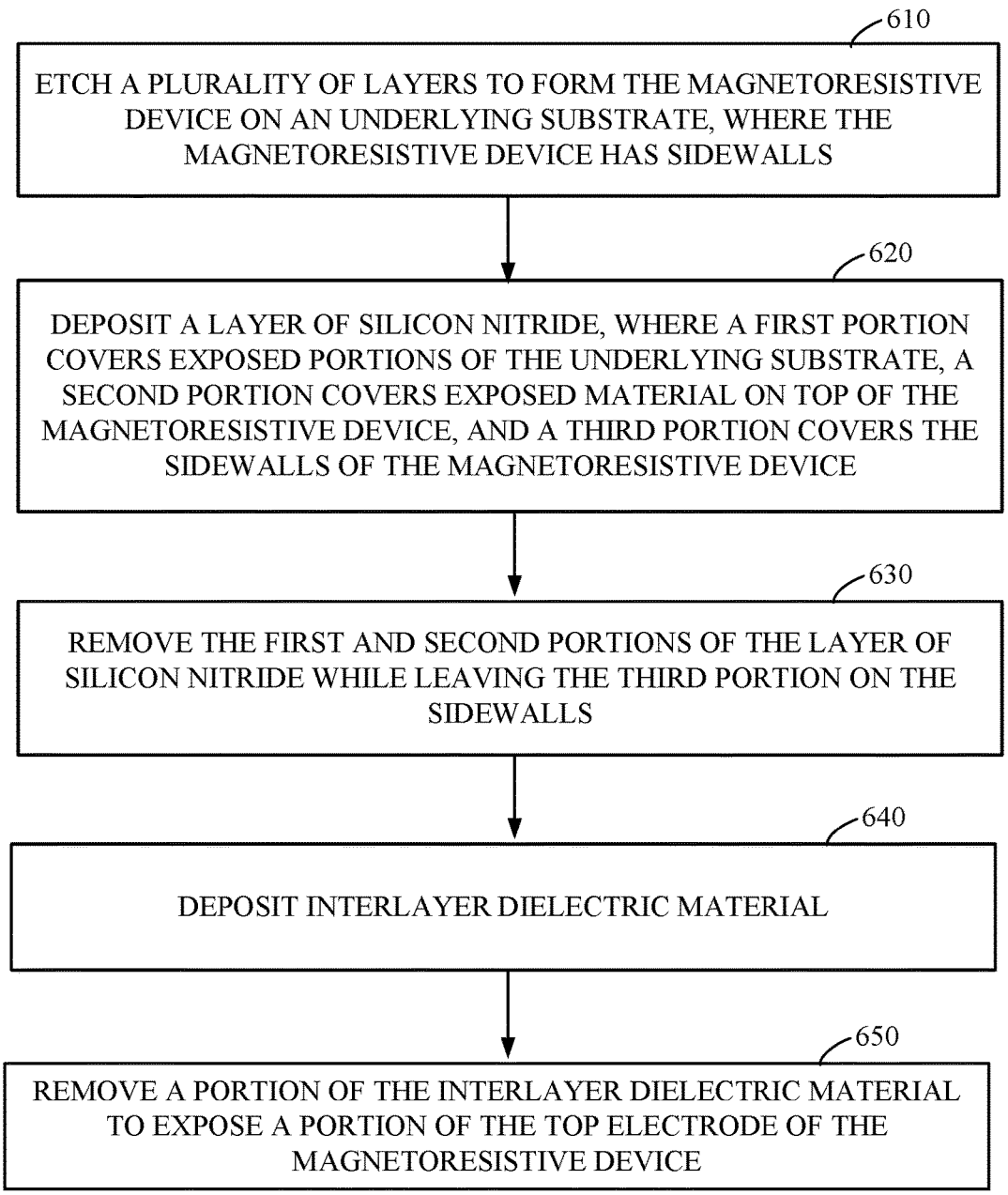
Figure 25:
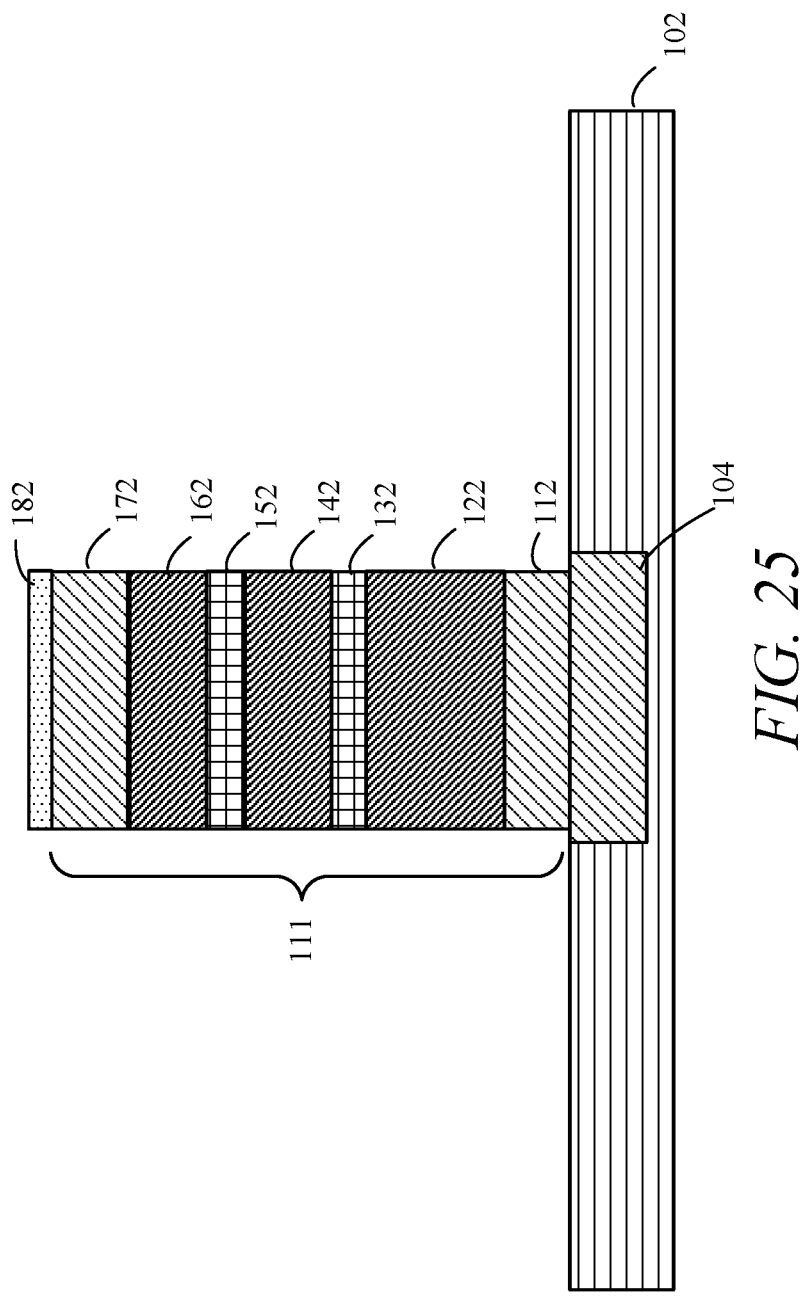
FIGS. 25-28 illustrate cross-sectional views of layers included in a magnetoresistive device during different stages of the manufacturing of a magnetoresistive device in accordance with another exemplary embodiment.

FIGS. 23 and 24 are flow charts that illustrate exemplary embodiments of a method of manufacturing a magnetoresistive device, where, in one example, the magnetoresistive device is a spin-torque MTJ device included in an MRAM or embedded MRAM integrated circuit. The operations included in the flow charts may represent only a portion of the overall process used to manufacture the device. For illustrative purposes, the following description of the methods in FIGS. 23 and 24 may refer to elements mentioned above in connection with FIGS. 1-22. It should be appreciated that the methods may include any number of additional or alternative tasks, the tasks shown in FIGS. 23 and 24 need not be performed in the illustrated order, and the methods may be incorporated into a more comprehensive procedure or process having additional functionality not described in detail herein. Moreover, one or more of the tasks shown in FIGS. 23 and 24 could be omitted from an embodiment as long as the intended overall functionality remains intact.

FIG. 23 illustrates a flow chart of a portion of the magnetoresistive device manufacturing process. At 510 a plurality of layers are etched to form the magnetoresistive device on an underlying substrate, where the magnetoresistive device has sidewalls. In some embodiments, the etching performed at 510 uses a hard mask as a template for the etching. In some embodiments, the etching is performed as a one-step etch at 512. Examples of such embodiments are illustrated in FIGS. 2-8. In other embodiments the etching is performed as a two-step etch using a single mask at 514. Examples of two-step etch embodiments are illustrated in FIGS. 9-18.

In some embodiments that include at least two etching steps, etching the plurality of layers includes etching a first portion of the plurality of layers to form an etched first portion of the magnetoresistive device, encapsulating the etched first portion of the magnetoresistive device to form and encapsulated first portion, and etching a second portion of the plurality of layers to form an etched second portion of the magnetoresistive device, where etching the second portion uses the encapsulated first portion of the magnetoresistive device as a template for etching the second portion of the plurality of layers. In some embodiments, the etched first portion of the magnetoresistive device includes the free layer(s) for the magnetoresistive device. Similarly, in some embodiments the etched second portion of the magnetoresistive device includes the tunnel barrier and the fixed layer(s) for the magnetoresistive device.

In yet other embodiments, the etching performed at 510 is accomplished using a different number of etching operations and may include one or more encapsulation operations as well. The etching at 510 results in a complete magnetoresistive device, and in some embodiments includes formation of a bottom electrode for the magnetoresistive device.

At 520 encapsulating material is deposited. In some embodiments, the encapsulating material is silicon nitride such that a layer of silicon nitride is deposited, whereas, as discussed above, in other embodiments other insulating materials are be used. A first portion of the encapsulating material covers exposed portions of the underlying substrate, which may correspond to the portions of the substrate that are not covered by the magnetoresistive device. A second portion of the encapsulating material covers exposed material on top of the magnetoresistive device. In some embodiments, this portion of the encapsulating material corresponds to the portion that covers the top portion of the top electrode of the magnetoresistive device or covers a hard mask overlying the top electrode if such a hard mask has not yet been removed. A third portion of the encapsulating material covers the sidewalls of the magnetoresistive device. In embodiments where the magnetoresistive device formation includes encapsulation between multiple etching steps, the third portion of the encapsulating material covers the sidewalls of that encapsulation material. An example of such an embodiment is shown in FIG. 13. In some embodiments, the integrated circuit on which the magnetoresistive device is formed also includes a logic portion that includes logic circuitry. In such embodiments, depositing the encapsulating material includes depositing the encapsulating material such that a fourth portion of the encapsulating material covers exposed portions of the logic portion of the integrated circuit.

At 530 the first and second portions of the encapsulating material are removed. Such removal can be accomplished by performing an etch back operation that selectively removes the first and second portions of the encapsulating material. The selective removal of the first and second portions leaves the third portion behind on the sidewalls of the magnetoresistive device. The third portion remaining on the sidewalls provides the protective encapsulation for the magnetoresistive device, thereby helping to ensure that the fully formed magnetoresistive device is not degraded during subsequent processing steps. In embodiments in which the magnetoresistive device is included on an integrated circuit with logic circuitry, the removal operation at 530 preferably removes the fourth portion of the encapsulating material from the logic portion of the integrated circuit device, thereby allowing for continued processing of the logic circuitry without interference from unwanted encapsulating material.

At 540 interlayer dielectric material is deposited. As illustrated in the embodiments described above, the interlayer dielectric material serves to separate the magnetoresistive device from other magnetoresistive devices as well as other surrounding circuitry on the integrated circuit device. The processing steps used to deposit the interlayer dielectric material can create a corrosive atmosphere that could damage the magnetoresistive device after its formation. By encapsulating the magnetoresistive device after it is formed, such damage to the magnetoresistive device can be avoided.

After deposition of the interlayer dielectric material, a contact or via can be formed in the interlayer dielectric material to provide access to the top portion of the magnetoresistive device. Any remaining hard mask material used for patterning the magnetoresistive device is removed in order to allow electrical contact to be made to the top portion of the magnetoresistive device. Hard mask removal can occur, for example, during etching to form the magnetoresistive device, during the etch back operation that removes portions of the encapsulating material, or during the formation of the contact or via. As discussed above, the encapsulation of the magnetoresistive device can also help to avoid unwanted shorting of the contact or via to underlying layers in the magnetoresistive device.

FIG. 24 illustrates a flow chart of a portion of the magnetoresistive device manufacturing process in accordance with another embodiment. At 610 a plurality of layers are etched to form the magnetoresistive device on an underlying substrate. Such etching may be performed in one or multiple etching steps as discussed above with respect to etching 510 in FIG. 23. Such etching results in a magnetoresistive device that has sidewalls, where a hard mask used to pattern the magnetoresistive device may or may not remain on the top of the magnetoresistive device after the etching step. Such a hard mask, if not electrically conductive, is removed prior to establishing electrical contact with the magnetoresistive device.

At 620 a layer of silicon nitride is deposited, where first portion covers exposed portions of the underlying substrate, a second portion covers exposed material on top of the magnetoresistive device, and a third portion covers the sidewalls of the magnetoresistive device. In embodiments in which a two-step etch with intervening encapsulation is used to form the magnetoresistive device, the material used for the intermediate encapsulation is also silicon nitride in some embodiments, whereas in other embodiments, different encapsulation materials are used. At 630 the first and second portions of layer of silicon nitride are removed while the third portion disposed on the sidewalls of the magnetoresistive device is left behind. The silicon nitride removal at 630 can be accomplished using an etch back operation, where the etching performed to selectively remove the first and second portions may be a anisotropic, physical etch that selectively removes horizontal components of the layer of silicon nitride.

At 640 interlayer dielectric material is deposited, where the interlayer dielectric material fills in the spaces between magnetoresistive devices and covers the magnetoresistive device. In order to make contact to the magnetoresistive device embedded within the interlayer dielectric material, at 650 a portion of the interlayer dielectric material is removed to expose a portion of the top electrode of the magnetoresistive device. The selective removal of interlayer dielectric material at 650 can be accomplished using a selective etch that targets the interlayer dielectric material and etches that material at a faster rate than the silicon nitride residing on the sidewalls of the magnetoresistive device. As such, the silicon nitride can act as an etch stop that prevents the etching from removing more material than is intended. Moreover, once conductive material is deposited within the hole created in the interlayer dielectric material to make contact with top electrode of the magnetoresistive device, the silicon nitride remaining on the sidewalls of the magnetoresistive device ensures that unwanted short circuits between the top electrode and lower layers within the magnetoresistive device do not occur.

By encapsulating the entire magnetoresistive device structure after formation and prior to deposition of interlayer dielectric material, the sidewalls of the magnetoresistive device are protected from the corrosive atmosphere that exists during interlayer dielectric material deposition. Such protection helps avoid degradation of the various layers included within the magnetoresistive device structure, thereby providing proper operation of the magnetoresistive device with less variation in operating characteristics between magnetoresistive devices included on the same integrated circuit. The encapsulation material on the sidewalls of the magnetoresistive device also help prevent unwanted short circuits between the top electrode of the magnetoresistive device and other layers below the top electrode within the magnetoresistive device structure.

Although the described exemplary embodiments disclosed herein are directed to various magnetoresistive-based devices and methods for making such devices, the present disclosure is not necessarily limited to the exemplary embodiments, which illustrate inventive aspects that are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method of manufacturing an integrated circuit that includes a magnetoresistive device having a magnetoresistive stack, comprising:
    etching a plurality of layers to form the magnetoresistive device on an underlying substrate, wherein the magnetoresistive device has sidewalls, wherein etching the plurality of layers includes:
        etching a first portion of the plurality of layers to form an etched first portion of the magnetoresistive device;
        encapsulating the etched first portion of the magnetoresistive device to form an encapsulated first portion of the magnetoresistive device; and
        etching a second portion of the plurality of layers to form an etched second portion of the magnetoresistive device, wherein etching the second portion uses the encapsulated first portion of the magnetoresistive device as a template for etching the second portion of the plurality of layers;
    depositing encapsulating material, wherein:
        a first portion of the encapsulating material covers exposed portions of the underlying substrate;
        a second portion of the encapsulating material covers exposed material on top of the magnetoresistive device; and
        a third portion of the encapsulating material covers the sidewalls of the magnetoresistive device, wherein the sidewalls of the magnetoresistive device include sidewalls of the encapsulated first portion of the magnetoresistive device and the etched second portion of the magnetoresistive device;
    removing the first and second portions of the encapsulating material, wherein removing the first and second portions includes leaving the third portion of the encapsulating material that covers the sidewalls of the magnetoresistive device; and
    depositing interlayer dielectric material that covers the exposed portions of the underlying substrate and the encapsulation material covering the sidewalls of the magnetoresistive device.

2. The method of claim 1, wherein the magnetoresistive device includes a top electrode on the magnetoresistive stack, and wherein the method further comprises:
    etching a hole in the interlayer dielectric to expose at least a portion of the top electrode; and
    depositing conductive material in the hole to form a via electrically coupled to the top electrode.

3. The method of claim 2, wherein:
    etching the hole includes etching the hole such that the hole extends below the top electrode of the magnetoresistive device, wherein etching the hole uses an etching chemistry selective to the interlayer dielectric material such that the interlayer dielectric material is selectively removed in comparison to the encapsulating material; and
    wherein depositing the conductive material in the hole includes depositing the conductive material such that encapsulating material covering a portion of the sidewalls of the magnetoresistive device lies between the conductive material and the portion of the sidewalls of the magnetoresistive device.

4. The method of claim 1, wherein removing the first and second portions of the encapsulating material further comprises performing an etch back to remove the first and second portions of the encapsulating material.

5. The method of claim 4, wherein the integrated circuit includes a logic portion that includes logic circuitry, and wherein:
    depositing the encapsulating material includes depositing the encapsulating material such that a fourth portion of the encapsulating material covers exposed portions of the logic portion of the integrated circuit; and
    performing the etch back further includes performing the etch back to remove the first, second, and fourth portions of the encapsulating material.

6. The method of claim 1, wherein material used to encapsulate the etched first portion of the magnetoresistive device is a same material as the encapsulating material deposited corresponding to the first, second, and third portions.

7. The method of claim 1, wherein the etched first portion of the magnetoresistive device includes a top electrode and a free layer.

8. The method of claim 7, wherein the etched second portion of the magnetoresistive device includes a tunnel barrier layer and a fixed layer.

9. The method of claim 1, wherein etching the first portion of the plurality of layers to form the etched first portion of the magnetoresistive device uses a hard mask as a template for etching, and wherein the method further comprises removing the hard mask prior to depositing the interlayer dielectric material.

10. The method of claim 1, wherein depositing encapsulating material further comprises depositing a layer of silicon nitride.

11. The method of claim 1, wherein depositing encapsulating material further comprises depositing a layer of silicon nitride ($Si_3N_4$) that has a thickness within a range of 10-25 nanometers.

12. The method of claim 1, wherein depositing encapsulating material further comprises depositing a layer of aluminum oxide.

13. The method of claim 1, wherein depositing encapsulating material further comprises depositing a layer of magnesium oxide.

14. The method of claim 1, wherein depositing encapsulating material further comprises depositing a layer of silicon oxide.

15. The method of claim 1, wherein depositing encapsulating material further comprises depositing a layer of material that includes one or more of aluminum oxide, silicon oxide, magnesium oxide, and silicon nitride.

16. A method of manufacturing an integrated circuit that includes a magnetoresistive device having a magnetoresistive stack and a top electrode, comprising:
   etching a plurality of layers to form the magnetoresistive device on an underlying substrate, wherein the magnetoresistive device has sidewalls, wherein etching the plurality of layers includes:
      etching a first portion of the plurality of layers to form an etched first portion of the magnetoresistive device;
      encapsulating the etched first portion of the magnetoresistive device to form an encapsulated first portion of the magnetoresistive device; and
      etching a second portion of the plurality of layers to form an etched second portion of the magnetoresistive device, wherein etching the second portion uses the encapsulated first portion of the magnetoresistive device as a template for etching the second portion of the plurality of layers;
   depositing a layer of silicon nitride, wherein:
   a first portion of the layer of silicon nitride covers exposed portions of the underlying substrate;
   a second portion of the layer of silicon nitride covers exposed material on top of the magnetoresistive device; and
   a third portion of the layer of silicon nitride covers the sidewalls of the magnetoresistive device;
   removing the first and second portions of the layer of silicon nitride, wherein removing the first and second portions includes leaving the third portion of the layer of silicon nitride that covers the sidewalls of the magnetoresistive device, wherein the sidewalls of the magnetoresistive device include sidewalls of the encapsulated first portion of the magnetoresistive device and the etched second portion of the magnetoresistive device;
   depositing interlayer dielectric material that covers the exposed portions of the underlying substrate, the top electrode of the magnetoresistive device, and the encapsulation material covering the sidewalls of the magnetoresistive device; and
   removing a portion of the interlayer dielectric material to expose a portion of the top electrode.

17. The method of claim 16, wherein:
   removing a portion of the interlayer dielectric material further comprises:
      etching a hole that extends below the top electrode of the magnetoresistive device, wherein etching the hole uses an etching chemistry selective to the interlayer dielectric material such that the interlayer dielectric material is selectively removed in comparison to the third portion of the silicon nitride.

18. The method of claim 16, wherein encapsulating the etched first portion of the magnetoresistive device further comprises encapsulating the etched first portion of the magnetoresistive device using silicon nitride such that silicon nitride is formed on the sidewalls of the etched first portion of the magnetoresistive device.

19. The method of claim 16, wherein depositing a layer of silicon nitride further comprises depositing a layer of silicon nitride that has a thickness within a range of 5-40 nanometers.

20. The method of claim 16, wherein depositing a layer of silicon nitride further comprises depositing a layer of silicon nitride that has a thickness within a range of 10-25 nanometers.

* * * * *